US008354884B2

(12) United States Patent
Braithwaite

(10) Patent No.: US 8,354,884 B2
(45) Date of Patent: Jan. 15, 2013

(54) MEASUREMENT AND CORRECTION OF RESIDUAL NONLINEARITIES IN A DIGITALLY PREDISTORTED POWER AMPLIFIER

(75) Inventor: Richard Neil Braithwaite, Orange, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 89 days.

(21) Appl. No.: 12/950,770

(22) Filed: Nov. 19, 2010

(65) Prior Publication Data

US 2011/0121897 A1 May 26, 2011

Related U.S. Application Data

(60) Provisional application No. 61/264,566, filed on Nov. 25, 2009.

(51) Int. Cl.
    *H03F 1/26* (2006.01)
(52) U.S. Cl. ...................................................... 330/149
(58) Field of Classification Search .................. 330/149; 375/296, 297; 455/114.3
    See application file for complete search history.

(56) References Cited

U.S. PATENT DOCUMENTS

| 5,990,734 A * | 11/1999 | Wright et al. ..................... 330/2 |
| 6,566,948 B1 | 5/2003 | Braithwaite |
| 2010/0283540 A1 * | 11/2010 | Davies ........................... 330/149 |

OTHER PUBLICATIONS

R.G. Brown, "Introduction to Random Signal Analysis and Kalman Filtering," New York, New York, Wiley and Sons, 1983.
R. N. Braithwaite, "Measurement and correction of residual nonlinearities in a digitally predistorted power amplifier," 75th ARFTG Microwave Meas. Conf, Anaheim, CA, May 28, 2010, pp. 14-17.
R. N. Braithwaite and S. Carichner, "An improved Doherty amplifier using cascaded digital predistortion and digital gate voltage enhancement," IEEE Trans. Microwave Theory and Techniques, vol. 57, No. 12, pp. 3118-3126, Dec. 2009.
R. N. Braithwaite, "Wide bandwidth adaptive digital predistortion of power amplifiers using reduced order memory correction," 2008 IEEE MTT-S International Microwave Symposium, Atlanta, GA, Jun. 15-20, 2008, pp. 1517-1520.
R. N. Braithwaite, "Memory correction of a Doherty power amplifier with a WCDMA input using digital predistortion," 2006 IEEE MTT-S International Microwave Symposium, San Francisco, CA, Jun. 11-16, 2006, pp. 1526-1529.
A. Zhu, J. C. Pedro, and T. R. Cunba, "Pruning the Volterra series for behavioral modeling of power amplifiers using physical knowledge," IEEE Trans. Microwave Theory and Techniques, vol. 55, No. 5, pp. 813-821, May 2007.
A. Zhu, P. 1. Draxler, J. J. Yan, T. J. Brazil, D. F. Kimball, and P. M. Asbeck, "Open-Loop digital predistorter for RF power amplifiers using dynamic deviation reduction-based Volterra series," IEEE Trans. Microwave Theory and Techniques, vol. 56, No. 7, pp. 1524-1534, Jul. 2008.

(Continued)

*Primary Examiner* — Robert Pascal
*Assistant Examiner* — Khiem Nguyen
(74) *Attorney, Agent, or Firm* — OC Patent Law Group

(57) ABSTRACT

A reduced cost method for the measurement and correction of residual nonlinearities in a digitally predistorted transmitter is disclosed. Systems employing predistorters and power amplifiers are calibrated by processing actual input and output signals during the normal operation of the systems. The systems correct memoryless nonlinearities as well as both memoryless and memory based nonlinearities.

18 Claims, 12 Drawing Sheets

OTHER PUBLICATIONS

J. Staudinger, J. Nanan, and J. Wood, "Memory fading Volterra series model for high power infrastructure amplifiers," 2010 IEEE Radio Wireless Symposium, New Orleans, LA, Jan. 10-14, 2010, pp. 184-187.

L. Ding, G. T. Zhou, D. R. Morgan, Z. Ma, J. S. Kenney, J. Kim, and C. R. Giardina, "A robust digital baseband predistorter constructed using memory polynomials," IEEE Trans. Comm., vol. 52, No. 1, pp. 159-165, Jan. 2004.

O. Hammi, S. Carichner, B. Vassilakis, and F. M. Ghannouchi, "Synergetic crest factor reduction and baseband digital predistortion for adaptive 3G Doherty power amplifier Iinearizer design," IEEE Trans. Microwave Theory and Techniques, vol. 56, No. 11, pp. 2602-2608, Nov. 2008.

F. Mkadem, M. B. Ayed, S. Boumaiza, 1. Wood, and P. Aaen, "Behavioral modeling and digital predistortion of power amplifiers with memory using two hidden layers artificial neural networks," 2010 IEEE MTT-S International Microwave Symposium, Anaheim, CA, May 2010, pp. 656-659.

* cited by examiner

MEASUREMENT AND CORRECTION OF RESIDUAL NONLINEARITIES IN A DIGITALLY PREDISTORTED POWER AMPLIFIER

RELATED APPLICATION INFORMATION

The present application claims priority under 35 U.S.C. Section 119(e) to U.S. Provisional Patent Application Ser. No. 61/264,566 filed Nov. 25, 2009, the disclosure of which is incorporated herein by reference in its entirety.

BACKGROUND OF THE INVENTION

1. Field of the Invention

The present invention relates in general to predistortion linearized amplifier systems and related methods. More particularly, the invention is directed to adaptive predistortion systems and methods.

2. Description of the Prior Art and Related Background Information

A digital transmitter, such as those employed in cellular telephones, has a digital baseband stage, a modulator, and a power amplifier. In order for a transmitter to be powered by batteries, the power amplifier must be efficient. Unfortunately, efficient power amplifiers often exhibit undesirable nonlinear gain. Linearization methods such as digital predistortion can improve the overall system performance of digital transmitters, but these systems require calibration in order to ensure optimum system performance.

Accordingly, a need exists to improve the calibration of digital predistortion systems.

SUMMARY OF THE INVENTION

In a first aspect the present invention provides an adaptive predistortion linearized amplifier system comprising an input receiving a time varying communication signal and a first signal path coupled to the input, the first signal path comprising a predistorter coupled to the input and performing a predistortion operation on the time varying communication signal using predistortion coefficients and providing a predistorted signal, an amplifier receiving and amplifying the predistorted signal and providing an amplified signal, and an output coupled to the amplifier and providing the amplified signal as an output signal. The system further comprises a measurement circuit coupled to sample the output signal for providing an error signal envelope signal. The system further comprises a second signal path coupled to the input comprising a sampling circuit receiving the time varying communication signal and asynchronously sampling the time varying communication signal, and a demodulating circuit configured to derive a demodulated error signal related to nonlinearities of the amplifier based on the error signal and a signal derived from the sampled time varying communication signal. The system further comprises a coefficient calculator configured for using the demodulated error signal to adapt the predistorter coefficients.

In another aspect, the present invention provides a method for adaptive predistortion of an amplifier system having an input, an output, an amplifier, and a measurement circuit. The method comprises receiving a time varying input communication signal at the input along a first signal path, sampling the time varying input communication signal to derive a sampled input signal comprising a subset of sampled signals and providing the sampled input signal to a second signal path, pre-distorting the time varying input communication signal on the first signal path to provide a pre-distorted input signal, upconverting the pre-distorted input signal to provide a modulated transmission signal, and amplifying the modulated transmission signal to provide an output signal. The method further comprises sampling the output signal and providing the sampled output signal to a measurement circuit, deriving an error signal from the sampled output signal in the measurement circuit, detecting the error signal magnitude to provide an error signal envelope signal, demodulating the error signal employing a signal derived from the sampled input signal provided by the second path to derive a demodulated error signal related to nonlinearities of the power amplifier, and using the demodulated error signal to adapt the predistorter.

In another aspect, the present invention provides a method for adaptive predistortion using online measurement. The method comprises receiving a time varying input communication signal having a modulation corresponding to a constellation diagram having a disk-like region in an IQ plane, and extracting a portion of the time varying input communication signal values to create a calibration signal substantially corresponding to a circle within the disk-like region. The method further comprises pre-distorting and amplifying the time varying input communication signal to provide an amplified output, sampling and measuring the output and employing the calibration signal to derive a demodulated error signal, and using the demodulated error signal to adaptively update predistortion coefficients for said predistortion.

Further features and aspects of the invention are set out in the following detailed description.

DETAILED DESCRIPTION OF THE INVENTION

It is an object of the present invention to calibrate the linearity of systems employing predistorters and power amplifiers by processing actual input and output signals during the normal operation of the systems. Sampling the signals "on-line" during the normal operation of the system eliminates the need for systems to go "off-line" and be temporarily removed from service. As such, embodiments of the present invention reduce system costs and improve overall performance.

It is a further object of the present invention to correct power amplifier nonlinearities that are memoryless or memory based. For memoryless nonlinear devices, the nonlinearities are functions of the instantaneous input signal values. But for power amplifiers exhibiting memory effects, the nonlinearities are functions of both the instantaneous signal values and the past signal values. Memory effects are often more pronounced when the bandwidth of the input signal is large. As such, embodiments of the present invention enable systems to correct nonlinearities over a wide range of operating parameters.

A digital transmitter, such as those in a cellular phone, comprises a digital baseband stage, modulator, and power amplifier. An efficient power amplifier, needed for battery powered operation, is nonlinear in terms of the gain as a function of the input signal envelope. As a result, a linearization method such as digital predistortion is required to reduce the distortion generated by the transmitter below the spectral emission mask associated with the chosen modulation format. Digital predistortion involves introducing a nonlinear gain function into the digital transmission path that opposes subsequent nonlinearities present in the modulator and power amplifier stages. The overall linearity is improved and the distortion produced by the predistorted system is less than that of the uncorrected transmitter.

Adaptive digital predistortion techniques estimate the residual nonlinearity of the predistorted transmitter from measurements of the output of the power amplifier. From these estimates, the predistorter coefficients are adjusted to reduce further the residual distortion present in the output signal.

An inherent problem with adaptive approaches to linearization is that the measurement system cannot distinguish distortion generated by nonlinearities in the transmitter from distortion induced by nonlinearities in the data acquisition components. The data acquisition components within the measurement circuitry must be significantly more linear than the desired linearity of the transmitter after predistortion to avoid degrading the output spectral mask. As a result, the measurement circuitry is often expensive.

Figure 1:
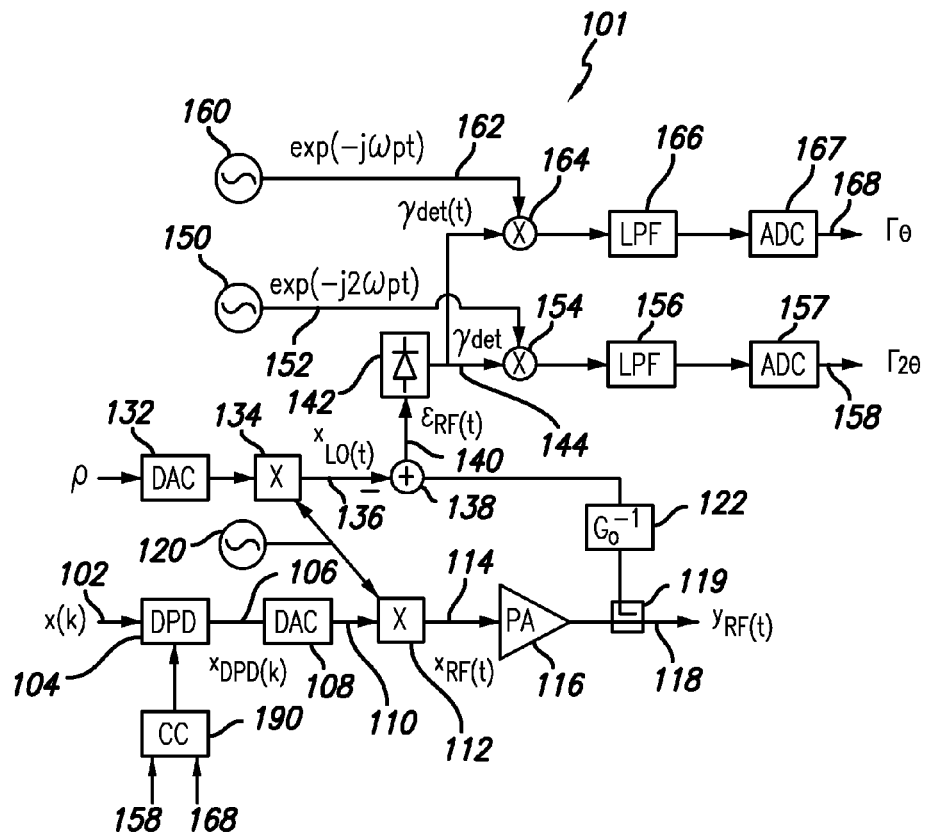
FIG. 1 is a block schematic drawing of an predistortion linearized amplifier system employing an off-line calibration mode.

An inexpensive approach for measuring nonlinearities in a digital transmitter employing an off-line memoryless system 101 presented in U.S. Pat. No. 6,566,948 is incorporated by reference in its entirety. Referring to FIG. 1, the theory of operation of this off-line approach will first be discussed to provide background for the improved system and method of the present invention with provides on-line adaptation and improved adaptation modeling. System 101 has a first signal path comprising an input calibration signal x(k) 102 that is received by the digital predistorter 104 which performs a predistortion operation on the input signal x(k) 102 using predistortion coefficients and provides a predistorted baseband signal $x_{DPD}(k)$ 106. The digital to analog convertor 108 receives the predistorted baseband signal $x_{DPD}(k)$ 106 and converts the digital signal into the analog output signal 110. Modulator 112 receives the analog output signal 110 and the output of local oscillator 120 and yields $x_{RF}(t)$ signal 114. The power amplifier 116 receives and amplifies the $x_{RF}(t)$ signal 114 and provides an output signal $y_{RF}(t)$ 118.

System 101 has a measurement circuit comprising a sampling coupler 119 which samples the output signal $y_{RF}(t)$ 118. The output signal $y_{RF}(t)$ 118 is received by gain adjustment block 122 and then is fed to combiner 138. The digital to analog convertor 132 receives a digital signal ρ and provides an unmodulated constant signal to combiner 134, which combines the unmodulated signal with the output of local oscillator 120 to provide a carrier signal 136. Combiner 138 subtracts the carrier signal 136 from the output of the gain adjustment block 122 to provide an error signal $\epsilon_{RF}(t)$ 140. Square law detector 142 is coupled to the combiner 138 and provides an envelope signal $\gamma_{det}$ 144.

System 101 then processes the envelope signal $\gamma_{det}$ 144 to determine updated predistortion coefficients that are fed back to the digital predistorter 104. Specifically, demodulation elements 154 and 164 each receives the envelope signal $\gamma_{det}$ 144. Demodulation element 164 receives the output from first harmonic source 160 and provides a signal that is fed into low pass filter 166. The output of low pass filter 166 is received by analog to digital convertor 167 which provide first harmonic error measurement $\Gamma_\theta$. Likewise, demodulation element 154 receives the output from second harmonic source 150 and provides a signal that is fed into low pass filter 156. The output of low pass filter 156 is received by analog to digital convertor 157 which provides second harmonic error measurement $\Gamma_{2\theta}$. The first and second harmonic error measurements $\Gamma_\theta$ and $\Gamma_{2\theta}$ are received by coefficient calculator 190 which provides updated predistortion coefficients to the digital predistorter 104.

The measurement circuit reduces the amplitude-varying ("AM") components, which reduces the nonlinearities of the measurement circuit. The measurement circuit contains a cancellation loop (i.e., carrier signal $x_{LO}(t)$ that is subtracted from the output of the gain adjustment block 122) that reduces AM variations in the envelope signal 144 when the loop is balanced and eliminates the variations completely when the transmitter is linear as well. Since the amplitude is nearly constant at the detector, less distortion is generated by nonlinearities in the measurement circuit than nonlinearities within the power amplifier. As a result, the linearity requirements of the data acquisition components are relaxed and the cost of the adaptive system is reduced.

The drawback of this approach is that the measurements must be performed off-line because of the use of the input calibration signal x(k) 102. It is preferable to optimize the system adaptively based on measurements made while transmitting the actual signals.

As discussed above, updated predistortion coefficients for a memoryless model are estimated based on the first and second harmonic error measurements $\Gamma_\theta$ and $\Gamma_{2\theta}$. In one model, the nonlinearities of the digital predistorter 104 and the power amplifier 116 may be represented by polynomials. Assume that the predistorted baseband signal $x_{DPD}(k)$ 106 is represented as $$x_{DPD}(k)=G_{DPD}(|x|)\cdot x(k) \quad (\text{Eq. 1})$$

where $G_{DPD}$ is the predistortion gain which is a nonlinear function of $|x|$. The predistorted baseband signal is up-converted to RF to generate $x_{RF}(t)$ signal 114

$$x_{RF}(t)=h\{x_{DPD}(k)\}\cdot \exp(j\cdot \omega_{LO}\cdot t) \quad (\text{Eq. 2})$$

where $h\{\ \}$ is a reconstruction filter used in the digital to analog convertor 108 and $\omega_{LO}(t)$ is the LO frequency of local oscillator 120. The output $y_{RF}(t)$ 118 of the power amplifier is $$y_{RF}(t)=G_{PA}(|x_{RF}|)\cdot x_{RF}(t) \quad (\text{Eq. 3})$$

where $G_{PA}$ is the gain of the power amplifier which is a nonlinear function of $|x_{RF}|$.

Memoryless nonlinearities are often described using AM-AM and AM-PM curves where the amplitude and phase components of the gain are plotted as a function of the input envelope. The gain curves produced by the digital predistortion module are represented using a polynomial function of order N:

$$G_{DPD}(|x|) = \sum_{i=0}^{N-1} b_i \cdot |x|^i. \quad (\text{Eq. 4})$$

The gain of the predistorted transmitter, which is the combination of the digital predistorter 104 and the power amplifier 116 nonlinearities, can also be approximated by a polynomial:

$$G_{trans}(|x|) = G_{PA}(|x_{RF}|) \cdot G_{DPD}(|x|) = \sum_{i=0}^{N-1} a_i \cdot |x|^i. \quad (\text{Eq. 5})$$

The coefficient $a_0$ is the actual gain of the digital predistorter 104 that has a desired value is denoted by $G_o$. The remaining coefficients, $a_{i>0}$, represent the residual memoryless nonlinearity. The approach discussed below measures the residual nonlinearity and adjusts the predistorter coefficients, $b_i$, to reduce the residual nonlinearity further.

As discussed above, input calibration signal x(k) 102 is used for calibration purposes. One form of the input calibration signal x(k) 102 contains a constant component and a time-varying component $$x(k)=\rho\cdot[1+\lambda\cdot\exp(j\cdot\omega_p\cdot kT)] \quad (\text{Eq. 6})$$

where $\rho$ and $\lambda$ are constants, $\omega_p$ is the frequency of modulation, and T is the sampling interval.

Figure 2:
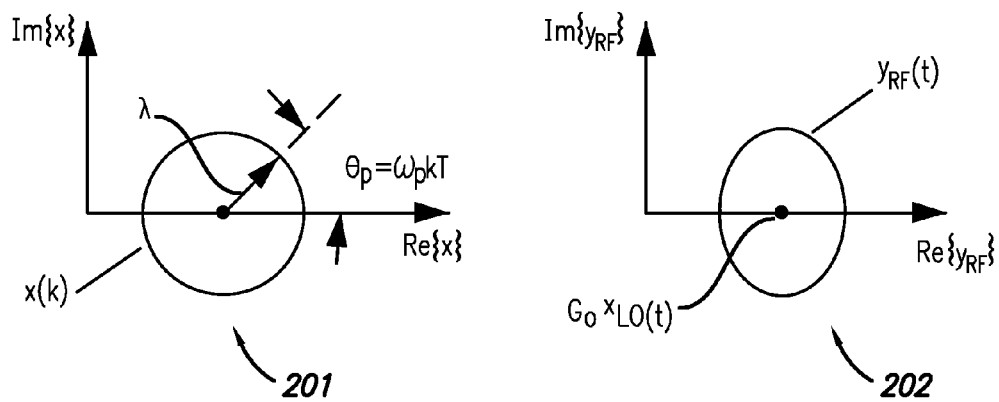
FIG. 2 are plots of the baseband input and output signals showing the deformation of the circular trajectory of the input signal on the output signal.

Referring to FIG. 2, the input trajectory plot 201 of the baseband input calibration signal x(k) 102 and the output trajectory plot 202 of output $y_{RF}(t)$ signal 118 illustrate the deformation of the circular trajectory of the input signal on the output signal. The calibration signal appears as an offset circle within the IQ trajectory of the input signal x(k). Nonlinearities within the transmitter deform the trajectory within the output signal $y_{RF}(t)$ 118. Measurements of the deformation assist in the adaptation of the predistorter.

The calibration signal has an AM component, controlled by the selection of $\rho$ and $\lambda$, which stimulates the nonlinear modes of the power amplifier. The AM component can be minimized by applying a cancellation loop prior to making any measurements. With the AM component removed, the nonlinear modes of the measurement system are not stimulated. The cancellation loop output is $$\epsilon_{RF}(t)=G_o^{-1}\cdot y_{RF}(t)-x_{LO}(t) \quad (\text{Eq. 7})$$

where $$x_{LO}(t)=\rho\cdot\exp(j\cdot\omega_{LO}\cdot t). \quad (\text{Eq. 8})$$

The term $b_0$ of the predistortion module is used to align the loop to minimize variations in $|\epsilon_{RF}(t)|$.

The output of a square law detector 142

$$\gamma_{det}(t)=|\epsilon_{RF}(t)|^2 \quad (\text{Eq. 9})$$

is demodulated using harmonics of the calibration signal $$\Gamma_{m\theta} = \frac{1}{T}\cdot\int_0^T \gamma_{det}\cdot\exp(-j\cdot m\cdot\omega_p\cdot t)\partial t. \quad (\text{Eq. 10})$$

Figure 3:
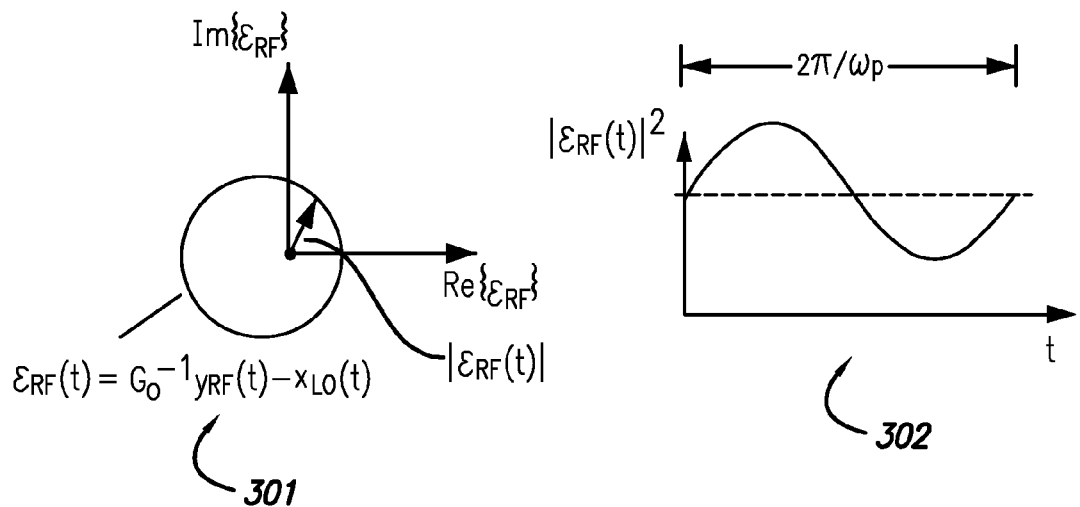
FIG. 3 are plots illustrating that loop misalignment is measured by demodulating the detected signal using the first harmonic of the calibration system.

The first harmonic error measurement 168, denoted by $\Gamma_\theta$, indicates misalignment of the cancellation loop. FIG. 3 illustrates these features. Plot 301 is a representation of the error signal $\epsilon_{RF}(t)$ illustrating loop misalignment and plot 302 illustrates demodulating the detected signal using the first harmonic of the calibration system.

Figure 4:
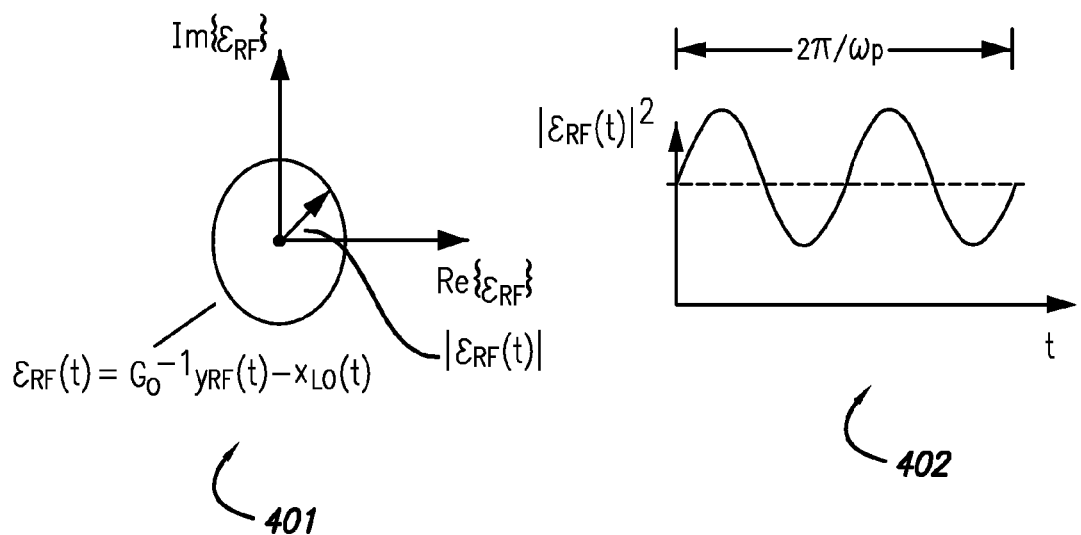
FIG. 4 are plots illustrating that nonlinearities are measured by demodulating the detected signal using the second harmonic of the calibration system.

The second harmonic error measurement 158, denoted by $\Gamma_{2\theta}$, indicates the slope in the complex gain curves of the predistorted power amplifier (AM-AM and AM-PM) near the operating point defined by $G_o x_{LO}(t)$. FIG. 4 presents plot 401 that is a representation of the error signal $\epsilon_{RF}(t)$ 140 that reflects the nonlinearities in the gain of the predistorted power amplifier and plot 302 illustrates demodulating the detected signal using the second harmonic of the calibration system.

The original approach is extended to allow the use of memoryless predistortion models with an order N that is greater than the number of measurements variables ($\Gamma_\theta$, $\Gamma_{2\theta}$) and the use of on-line signals for measuring the residual nonlinearity.

The relationship between the measurements ($\Gamma_\theta$, $\Gamma_{2\theta}$) and $a_i$ is approximated by $$M\cdot[(a_0^*-1)\ a_1^*\ a_2^*\ a_3^*]^T \approx \begin{bmatrix}\Gamma_\theta\\ \Gamma_{2\theta}\end{bmatrix} \quad (\text{Eq. 11})$$

where $(\ )^T$ indicates transpose, $$M = \begin{bmatrix}\rho^2\lambda & \rho^3 c_0\lambda & \rho^4\lambda & \rho^5 c_0\lambda\\ 0 & \rho^3 c_0 c_1\lambda & \rho^4\lambda^2 & \rho^5 c_0\lambda\cdot(c_1+\lambda)\end{bmatrix} \quad (\text{Eq. 12})$$

$$c_0 = \sqrt{1+\lambda^2} \quad (\text{Eq. 13})$$

$$c_1 = \frac{0.5\lambda}{1+\lambda^2}. \quad (\text{Eq. 14})$$

In general, measurements from several values of $\rho$ are needed to estimate $a_i$. An exceptional case occurs when $a_1=a_3=0$. Estimates of the residual nonlinearity, $a_i$, are used to update the coefficients of the predistorter, $b_i$, in an iterative manner as follows:

$$\underline{b}(t_{i+1})=\underline{b}(t_i)-\alpha\cdot[(\alpha_0-1)\alpha_1\alpha_2\alpha_3]^T \quad \text{(Eq. 15)}$$

where $\underline{b}(t_i)=[b_0\ b_1\ b_2\ b_3]^T$ at iteration $t_i$ and $0<\alpha<1$.

Alternatively, system 101 may also be calibrated off-line with a calibration signal with a representation of the calibration signal given by $$x(k)=\rho\cdot\{1+\lambda\cdot exp[j\cdot\theta(k)]\} \quad \text{(Eq. 16)}$$

where $\theta(k)$ varies with time, and $\lambda$ and $\rho$ are constant. When using this alternative representation of the calibration system, samples of $\gamma_{det}$ are stored, preferably in look-up-tables ("LUTs") as a function of quantized values of $\theta$ instead of time:

$$L_0(\theta_n) = \sum_k \beta_n(k) \quad \text{(Eq. 17)}$$

$$L_1(\theta_n) = \sum_k \beta_n(k) \cdot \gamma_{det}(k) \quad \text{(Eq. 18)}$$

$$L_2(\theta_n) = \sum_k \beta_n(k) \cdot |\gamma_{det}(k)|^2 \quad \text{(Eq. 19)}$$

where the quantization of $\theta$ is $$\beta_n(k) = \begin{cases} 1 & \text{when } |\theta(k)-\theta_n| < \frac{\pi}{N_{bins}} \\ 0 & \text{otherwise} \end{cases} \quad \text{(Eq. 20)}$$

LUTs $L_0$, $L_1$, and $L_2$ are the accumulated zero, first, and second-order moments of $\gamma_{det}$. The mean and variance of $\gamma_{det}$ for bin n are $$E[\gamma_{det}(\theta_n)] = \frac{L_1(\theta_n)}{L_0(\theta_n)} \quad \text{(Eq. 21)}$$

$$\sigma^2(\theta_n) = \frac{L_2(\theta_n)\cdot L_0(\theta_n)-[L_1(\theta_n)]^2}{[L_0(\theta_n)]^2}, \quad \text{(Eq. 22)}$$

respectively. Using the mean LUT, the demodulated signal becomes $$\Gamma_{m\theta} = \sum_{n=1}^{N_{bins}} E[\gamma_{det}(\theta_n)] \cdot \exp(-j\cdot m \cdot \theta_n). \quad \text{(Eq. 23)}$$

This alternative representation of the calibration signal has several advantages. New calibration signals are possible because $\theta(k)$ may be random instead of ordered values of $\omega_p kT$. In addition, the detector output $\gamma_{det}$ may be sampled asynchronously to accommodate slower speed acquisition hardware. The key requirement is that samples of $x(k)$ remain on the circular trajectory shown in FIG. 2 for the instances $t_s=kT$ used to sample $\gamma_{det}$.

In a preferred embodiment, systems employing predistorters and power amplifiers are calibrated by processing the actual input and output signals during the normal operation of the systems, also referred to herein as on-line calibration and adaptation. For example, the input signal may be in compliance with a Wideband Code Division Multiple Access (WCDMA) standard.

Moreover, preferred embodiments may detect and correct memoryless nonlinearities, while other embodiments preferably may detect and correct both memoryless and memory based nonlinearities. A first approach, discussed immediately below, employs systems that correct nonlinearities that are memoryless based. A second approach, discussed further below, describes systems that correct nonlinearities that are memoryless and memory based. Both approaches rely on asynchronous sampling of the input signal and other signals to generate error measurement parameters. Updated predistortion coefficients are then calculated based on the error measurement parameters, and then fed to the digital predistorter.

Figure 5:
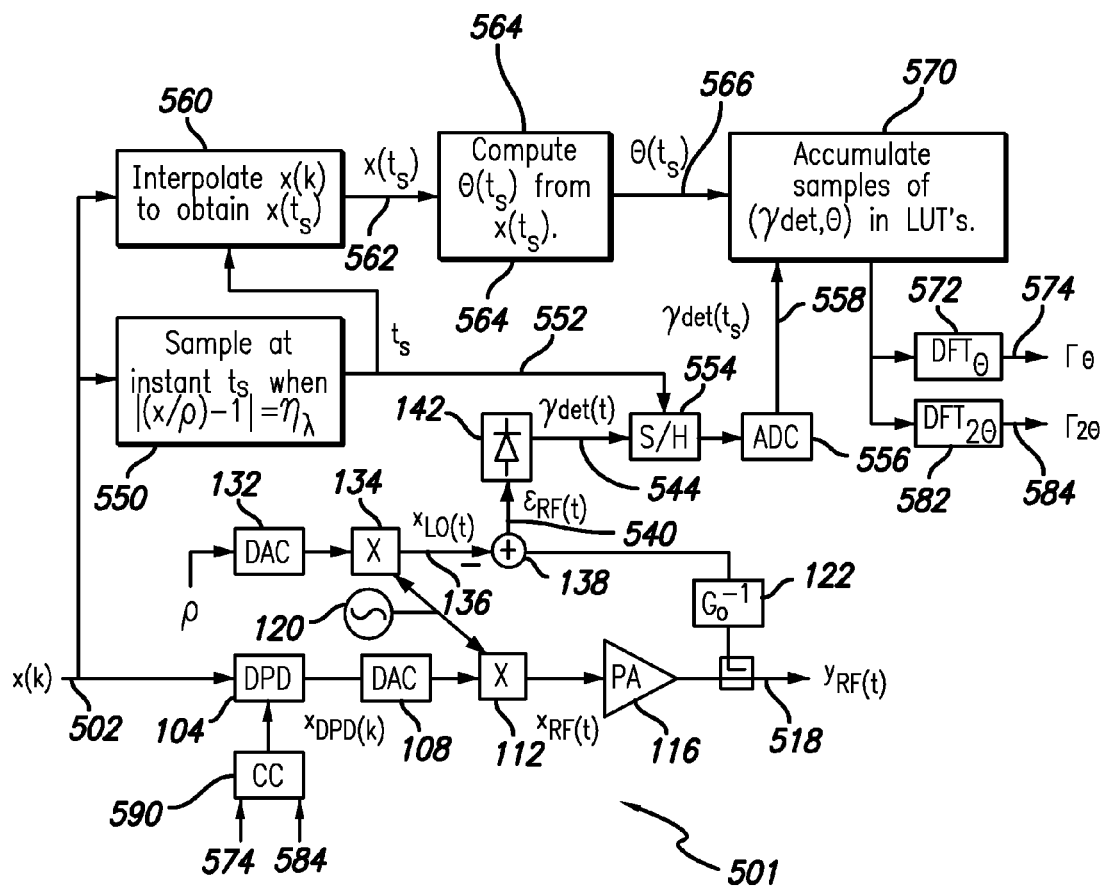
FIG. 5 is a block schematic drawing of an on-line, asynchronously-sampled predistortion linearized amplifier system for detecting memoryless nonlinearities where the sampling instant is triggered by the value of the instantaneous amplitude.

Referring to FIG. 5, a block schematic drawing of an on-line, asynchronously-sampled predistortion linearized amplifier system for detecting memoryless nonlinearities where the sampling instant is triggered by the value of the instantaneous amplitude is presented. On-line memoryless system 501 is configured to allow the use of the actual input signal in place of the calibration signal. In particular, the scale term for the modulation, $\lambda$, is allowed to vary over time. Asynchronous sampling is used to sample the input signal in order to extract only the samples that match the calibration signal used in the previous section. That is, the asynchronous samples of $\gamma_{det}$ and $x(k)$ are extracted at instances when $\lambda=\eta_\lambda$ where $\eta_\lambda$ is a constant. The samples of constant $\lambda$ are stored in look-up-tables and demodulated to estimate $(\Gamma_\theta, \Gamma_{2\theta})$.

As discussed above, the input signals during on-line operation of a system may have time-varying amplitudes and time-varying phases without having a constant component. However, as a means for modeling memoryless and memory based nonlinearities that extend the off-line model presented above, let the input signal be described as $$x(k)=\rho\cdot\{1+\lambda(k)\cdot\exp[j\cdot\theta(k)]\} \quad \text{(Eq. 24)}$$

where both $\lambda(k)$ and $\theta(k)$ vary with time. Assume that $\gamma_{det}$ is sampled asynchronously at the instances when $|(x(k)/\rho)-1|=\eta_\lambda$. The resulting constellation of the sampled points $(\rho, \lambda, \theta)$ coincides with the sampled trajectories of the original calibration signal shown in FIG. 2. If the nonlinearities within the predistorted transmitter are memoryless, there will be no difference compared to the off-line calibration case except for the extended observation time required due to the asynchronous sampling.

System 501 has a similar first signal path and measurement circuit as the off-line memoryless system 101 depicted in FIG. 1. System 501 also has a second signal path that is coupled to receive input signal 502 comprising an interpolating circuit 560 for asynchronously sampling the input signal 502 during a sampling instant. A computing circuit 564 computes the sampled instantaneous phase 566 based on the sampled input signal. The accumulating circuit 570 receives the sampled instantaneous phase 566 and a sampled envelope signal $\gamma_{det}$ 558 and calculates and stores moments in the Look Up Tables. DFT demodulating circuits 572 and 582 calculate the first and second harmonic error measurements 574 and 584 respectively. The first and second harmonic error measurements 574 and 584 are then fed into coefficient calculator 590 which provides updated predistortion coefficients to predistorter 104.

System 501 also has a third signal path receiving the input signal 502 comprising a sampling circuit 550 which is configured to measure the instantaneous amplitude of the input and triggers a sampling instant when the value of the instantaneous amplitude is substantially equal to a first predetermined level. The sampling circuit triggers the interpolating circuit 560 and a sample- and hold circuit 554. Sample- and hold circuit 554 is coupled to the square law detector and samples envelope signal $\gamma_{det}$ 544 during the sampling instant. The analog-to-digital convertor 556 receives samples of the envelope signal $\gamma_{det}$ 544, converts the signal into a digital representation, and sends the sampled envelope signal to the accumulating circuit 570.

Samples of $\gamma_{det}$ where $|(x(k)/\rho)-1|=\eta_\lambda$ are grouped together and stored in look-up-tables as a function of quantized values of θ. The LUTs are the same as Equations (17), (18), and (19) except that $\beta_n(k)$ is replaced by $$\beta_n(k; \eta) = \begin{cases} 1 & \text{when } |\theta(k) - \theta_n| < \frac{\pi}{N_{bins}}, \lambda = \eta \\ 0 & \text{otherwise.} \end{cases} \quad \text{(Eq. 25)}$$

DFT demodulating circuits 572 and 582 calculate the first and second harmonic error measurements 574 and 584 respectively. The demodulation is performed using (23) as in the previous section. Note that it is possible to maintain several sets of LUTs for different values of λ concurrently. The first and second harmonic error measurements 574 and 582 are then fed into coefficient calculator 590 which provides updated predistortion coefficients to predistorter 104.

Figure 6:
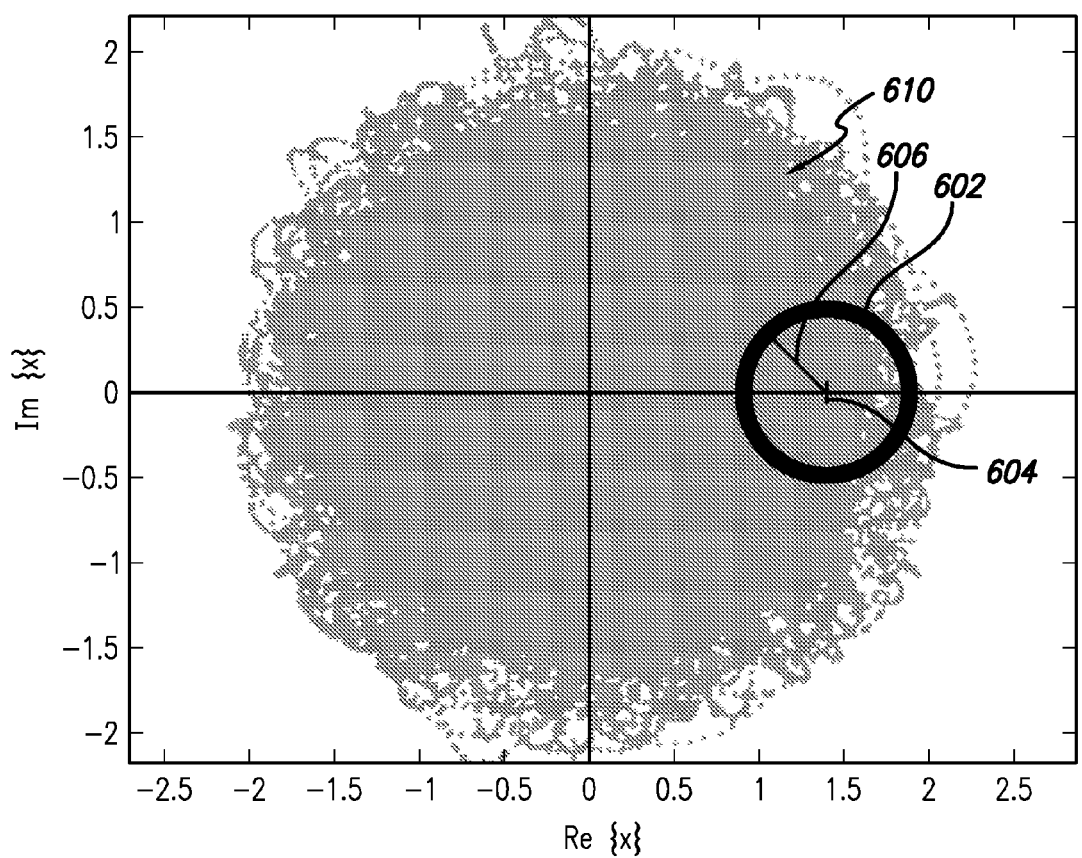
FIG. 6 is a plot showing that asynchronous sampling is employed to obtain the desired calibration signal from the real-time input signal, thereby enabling on-line calibration measurements.

Referring to FIG. 6, a plot showing that asynchronous sampling is employed to obtain the desired calibration signal from the real-time input signal, thereby enabling on-line calibration measurements is illustrated. In this example, WCDMA input signals 610 having time-varying λ(k) and θ(k) occupy a large portion of space defined by imaginary part of the input signal along the y axis and the real part of the input signal along the z axis. Circular trajectory 602 with radius 606 and origin 604 represents the sampled input signals having a constant λ. Asynchronous sampling enables the system 501 to obtain the desired calibration signal from the WCDMA signal and allow calibration during on-line operation.

Figure 7:
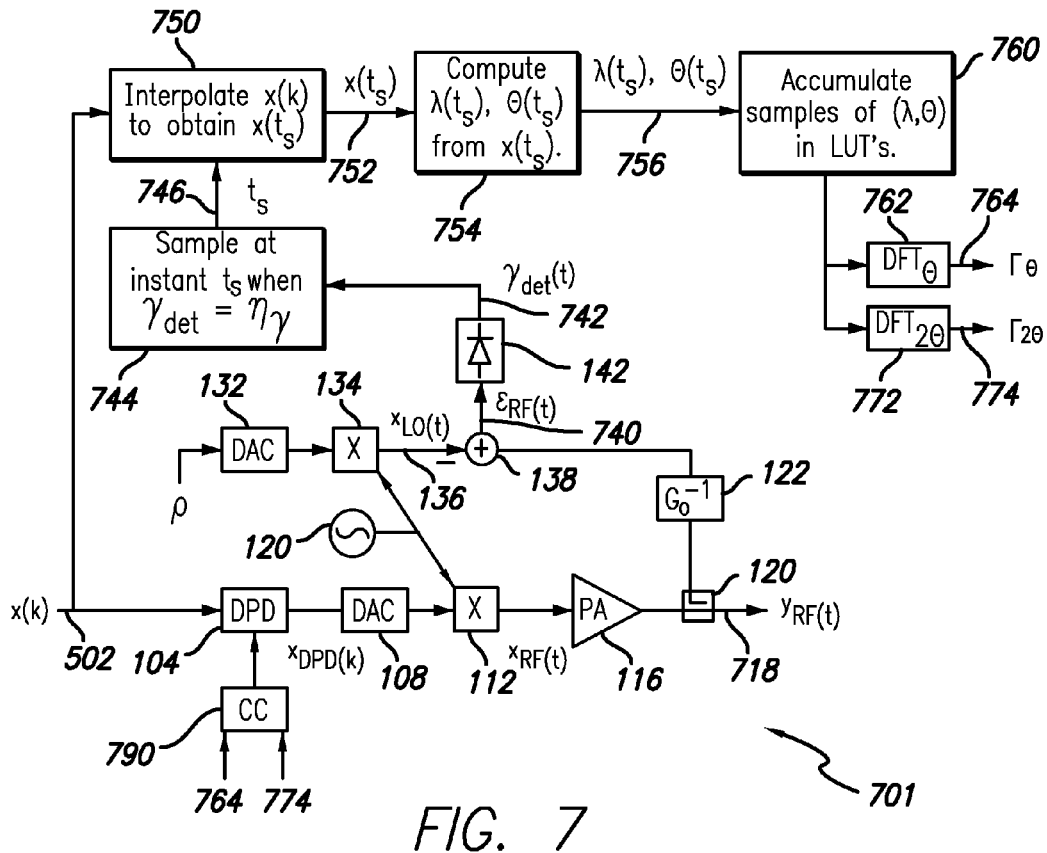
FIG. 7 is a block schematic drawing of an on-line, asynchronously-sampled predistortion linearized amplifier system for detecting memoryless nonlinearities where the sampling instant is triggered by the value of the envelope signal.

FIG. 7 presents an embodiment of the first type in which memoryless nonlinearities are corrected. System 701 corrects memoryless nonlinearities by employing asynchronous sampling triggered by the value of the envelope signal. In this case, the samples are selected such that $\gamma_{det}=\eta_\gamma$ making the output trajectory circular and the input trajectory deformed as a result of residual nonlinearity.

On-line memoryless system 701 depicted in FIG. 7 has a similar first signal path and measurement circuit as the off-line memoryless system 101 depicted in FIG. 1. System 701 also has a second signal path similar to that of system 501 depicted in FIG. 5 comprising an interpolating circuit 750 for asynchronously sampling the input signal 502 during a sampling instant. A computing circuit 754 computes the sampled instantaneous amplitude and phase 756 based on the sampled input signal. The accumulating circuit 760 receives the instantaneous amplitude and phase 756 and calculates and stores moments in the Look Up Tables. DFT demodulating circuits 762 and 772 calculate the first and second harmonic error measurements 764 and 774 respectively. The first and second harmonic error measurements 764 and 774 are then fed into coefficient calculator 790 which provides updated predistortion coefficients to predistorter 104.

System 701 also has an envelope sampling circuit 744 coupled to the square law detector 142, where the envelope sampling circuit 744 is configured for measuring the envelope signal $\gamma_{det}$ and triggering the sampling instant when a value of the envelope signal $\gamma_{det}$ is substantially equal to $\eta_\gamma$, a second pre-determined level.

System 701 computes the inverse nonlinearity of the transmitter by using the output of the detector, $\gamma_{det}$, to control the asynchronous sampling. The sampling instances are selected when $\gamma_{det}=\eta_\gamma$. The corresponding samples of x(k) are used to compute (ρ, λ, θ). As a result, the trajectory of the samples at the output $y_{RF}$ will be circular whereas the samples at the input x(k) will be deformed. The look-up-table capturing the first-order moment of λ (instead of $\gamma_{det}$) as a function of quantized values of θ is as follows:

$$L_1(\theta_n) = \sum_k \beta_n(k; \eta) \cdot \lambda(k) \quad \text{(Eq. 26)}$$

where the sampling and quantization of (λ,θ) is $$\beta_n(k; \eta) = \begin{cases} 1 & \text{when } |\theta(k) - \theta_n| < \frac{\pi}{N_{bins}}, \gamma_{det} = \eta \\ 0 & \text{otherwise.} \end{cases} \quad \text{(Eq. 27)}$$

The mean of λ for bin n and $\gamma_{det}=\eta_\gamma$ is $$E[\lambda_1(\theta_n)] = \frac{L_1(\theta_n)}{L_0(\theta_n)}. \quad \text{(Eq. 28)}$$

The demodulated signal for the inverse nonlinearity becomes $$\Gamma_{m\theta} = \sum_{n=1}^{Nbins} E[\lambda(\theta_n)] \cdot \exp(-j \cdot m \cdot \theta_n). \quad \text{(Eq. 29)}$$

Figure 8:
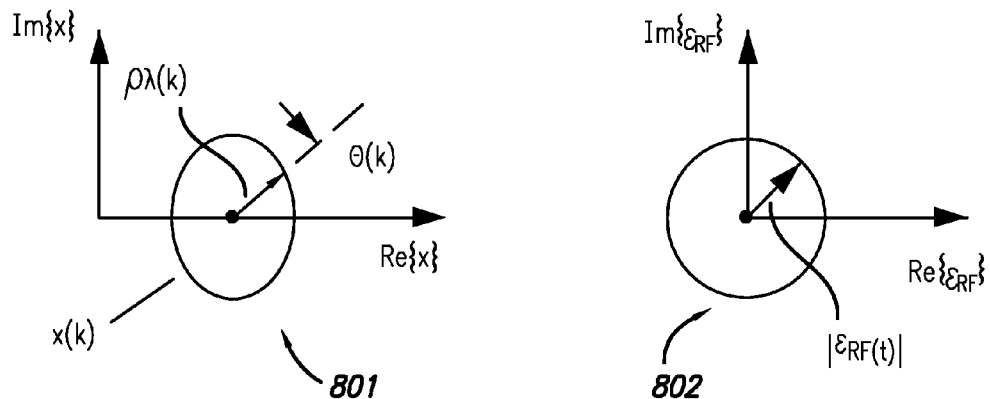
FIG. 8 are plots of input signal and error signal for the embodiment depicted in FIG. 7, which illustrate that the nonlinear gain of the transmitter deforms the circular trajectory of the input signal.

FIG. 8 presents a plot of input signal 801 and a plot of the error signal 802 for the embodiment depicted in FIG. 7 and shows the elliptical deformation associated with residual nonlinearities that appear in the selected input sample $x(t_s)$. The nonlinear gain of the digital predistorter 104 and power amplifier 116 deforms the circular trajectory at the input, instead of the output as shown in FIG. 2.

Coefficient calculators 590 and 790 receive the corresponding first and second harmonic error measurements $\Gamma_\theta$ and $\Gamma_{2\theta}$ and generate the updated predistortion coefficients that are received by the digital predistorter 104. A set of recursive equations is preferably used to combine measurements $(\Gamma_\theta, \Gamma_{2\theta})$ from several values of ρ as they are made:

$$K_{gain} = P_i \cdot M^H \cdot [M \cdot P_i \cdot M^H + R_i]^{-1} \quad \text{(Eq. 30)}$$

$$\underline{b}(i+1) = \underline{b}(i) - K_{gain}^* \cdot [\Gamma_\theta \Gamma_{2\theta}]^H \quad \text{(Eq. 31)}$$

$$P_{i+1} = (I_{4\times 4} - K_{gain} \cdot M) \cdot P_i + Q_i \quad \text{(Eq. 32)}$$

where ( )* and ( )$^H$ indicate conjugate and conjugate transpose, respectively, b(0)=[1 0 0 0]$^T$, $P_0$=2 $I_{4\times 4}$, $R_i$=0.0001 $I_{2\times 2}$, and $Q_i$=0.0002 $I_{4\times 4}$. The matrix P is the error covariance of b. Experiments show that it is beneficial to reset P to $P_0$ after a few cycles of the ρ set while retaining the current estimate of b. This is likely due to the approximation used for matrix M in (12) which assumes that residual nonlinearity is small (that is, [$a_0$ $a_1$ $a_2$ $a_3$]≈[1 0 0 0]).

Figure 9:
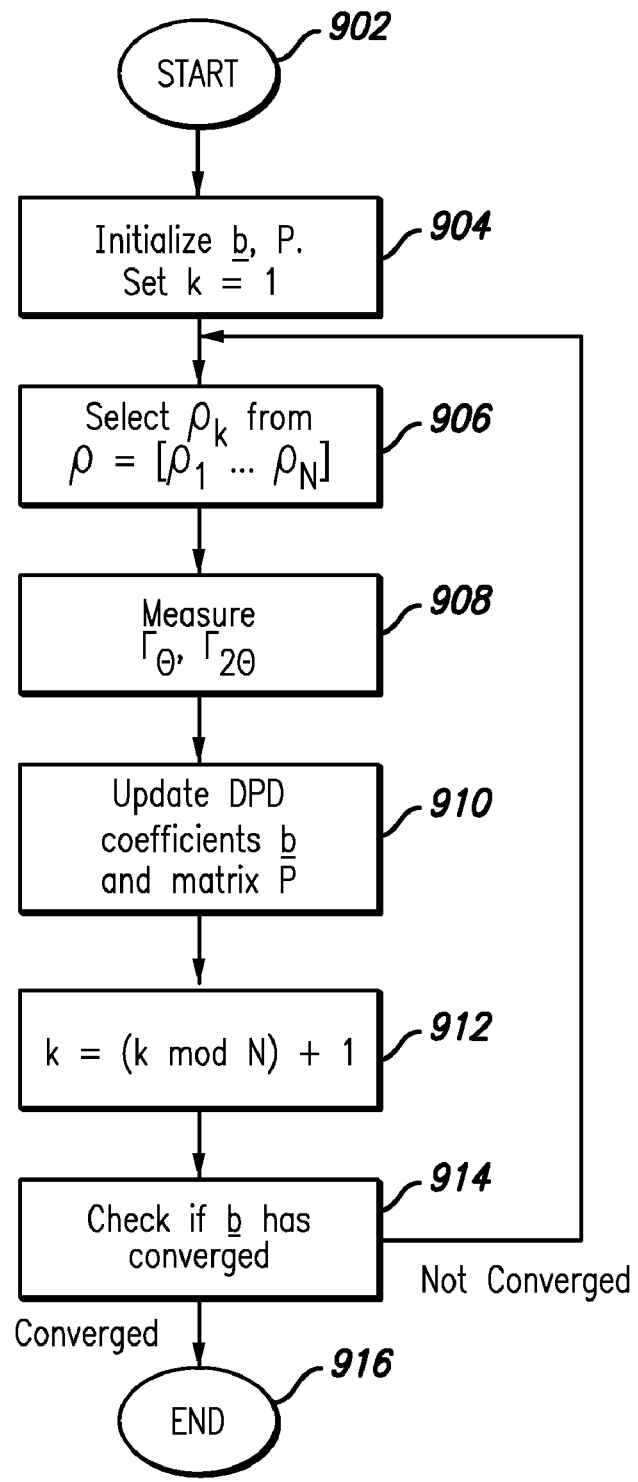
FIG. 9 is a flow chart of the process to estimate the predistortion coefficients based on the values of the demodulated signals.

FIG. 9 is a flow chart of the process to estimate the predistortion coefficients based on the values of the demodulated signals. At block 902, the process is started. At block 904, $\bar{b}$ and the matrix P are initialized, and bound variable k is set to 1. At block 906, $\rho_k$ is selected from a set $[\rho_1, \ldots, \rho_N]$. At block 908, the systems 501 or 701 processes the input signal 502 using the selected $\rho_k$, and the first and second harmonic error measurements $\Gamma_\theta$ and $\Gamma_{2\theta}$ are measured. At block 910, the coefficients $\bar{b}$, and the matrix P are updated using the recursive equations set forth in Equations 30-32. The digital predistorter 104 is updated with the new predistortion coefficients $\bar{b}$. At block 912, k is set to (k mod N)+1. At block 914, $\bar{b}$ is checked to determine whether it has converged. If $\bar{b}$ has converged, the process ends at block 916. If $\bar{b}$ has not converged, the process resumes at block 906.

The digital transmitter shown in FIG. 5 is simulated using Matlab to determine the steady-state performance of a polynomial predistorter tuned using measurements $(\Gamma_\theta, \Gamma_{2\theta})$ derived from asynchronous samples of a WCDMA signal. The WCDMA input signal has a 101 carrier configuration modulated at a center frequency of 2.14 GHz. Data captures of the input and output signals of a power amplifier without predistortion, $x_{RF}$ and $y_{RF}$, respectively, are used to compute the memoryless gain of the power amplifier ("PA") ($G_{PA}$) used in the simulation, which is represented as AM-AM and AM-PM LUTs. The sample rate of the digitized data captures are 122.88 MHz. The input data capture is also used as the input signal x(k) in the simulation.

Several values of $\rho$ are selected, $\rho=[0.5, 0.8, 1.1, 1.4]$, and tested sequentially to adapt the predistortion coefficients. For a given value of $\rho$, the signals $y_{RF}(t)$ and $\gamma_{det}(t)$ are computed from the input signal x(k), the current setting of the predistortion module, $G_{DPD}$, and the memoryless model of the PA, $G_{PA}$. A value of $\lambda$ is chosen ($\lambda=0.35$) and asynchronous sampling is applied to determine the sampling instants $t_s$ where $x(t_s)=\rho[1-\lambda\exp\{j\theta(t_s)\}]$ and the corresponding values of $\gamma_{det}(t_s)$. The best method for determining $t_s$ is to interpolate x(k) to localize the instants when x(k) crosses the circle defined by $(\rho,\lambda)$. However, for ease of implementation using Matlab, the signal x(k) is up-sampled by a factor of 4 and samples are selected if x(k) is within $0.025\lambda$ of the $(\rho,\lambda)$ circle. The values $\theta(t_s)$ and $\gamma_{det}(t_s)$ are accumulated in LUTs (18) and (25), from which $E[\gamma_{det}(t_s)]$ is computed using (21), then demodulated using (23) for m=[1,2] to produce measurements $\Gamma_\theta$ and $\Gamma_{2\theta}$.

Figure 10:
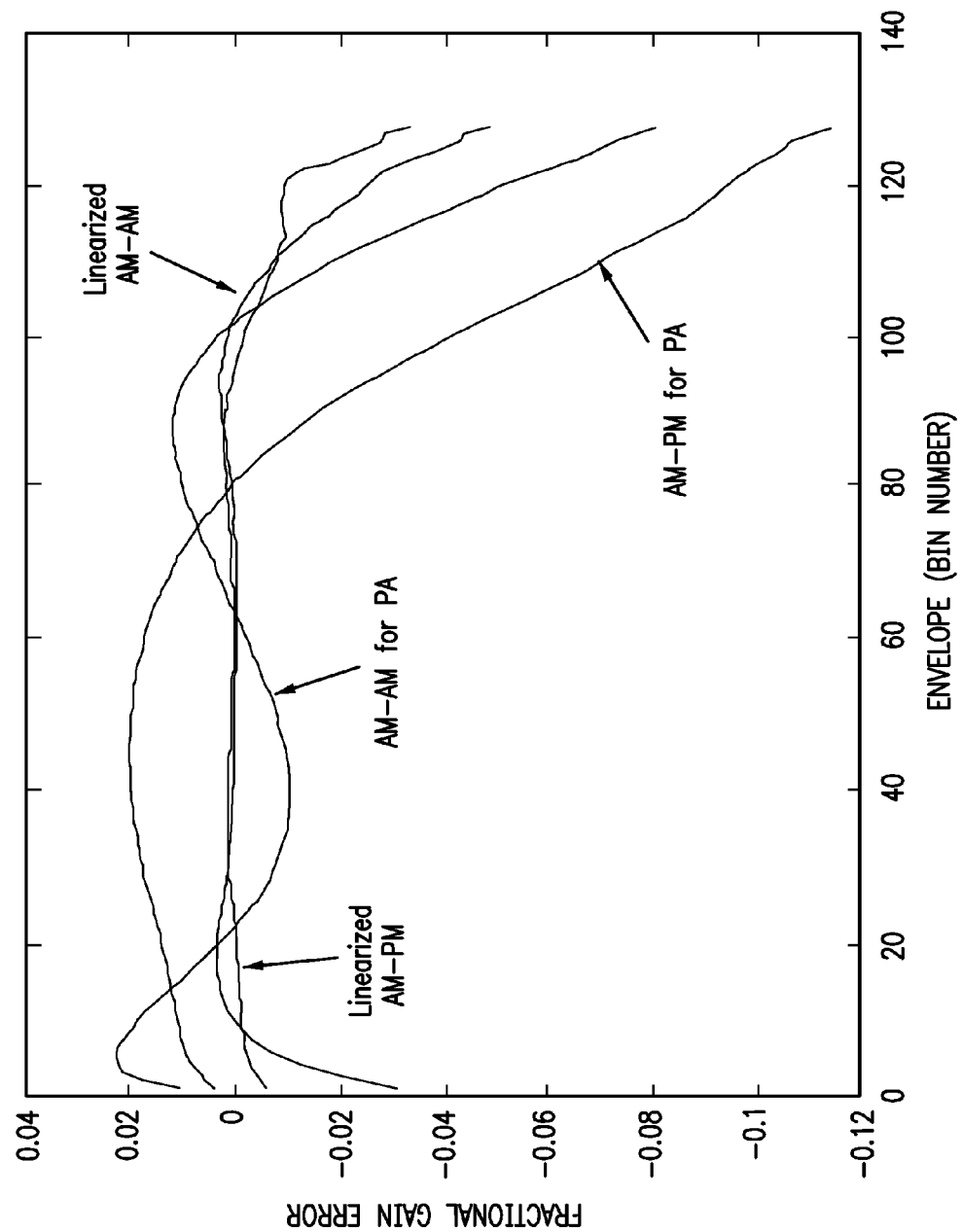
FIG. 10 is a representation of simulated AM-AM and AM-PM curves based on the memoryless nonlinearities PA model.

FIG. 10 is a representation of simulated AM-AM and AM-PM curves for the uncorrected and predistorted memoryless PA model. The ideal curves for a linear transmitter would be constant. It can be seen that the measurement system and the recursive equations (30)-(32) produce steady-state predistortion coefficients, $\bar{b}$, that flatten the AM-AM and AM-PM curves as desired over the input envelope range where the pdf has the highest density.

Figure 11:
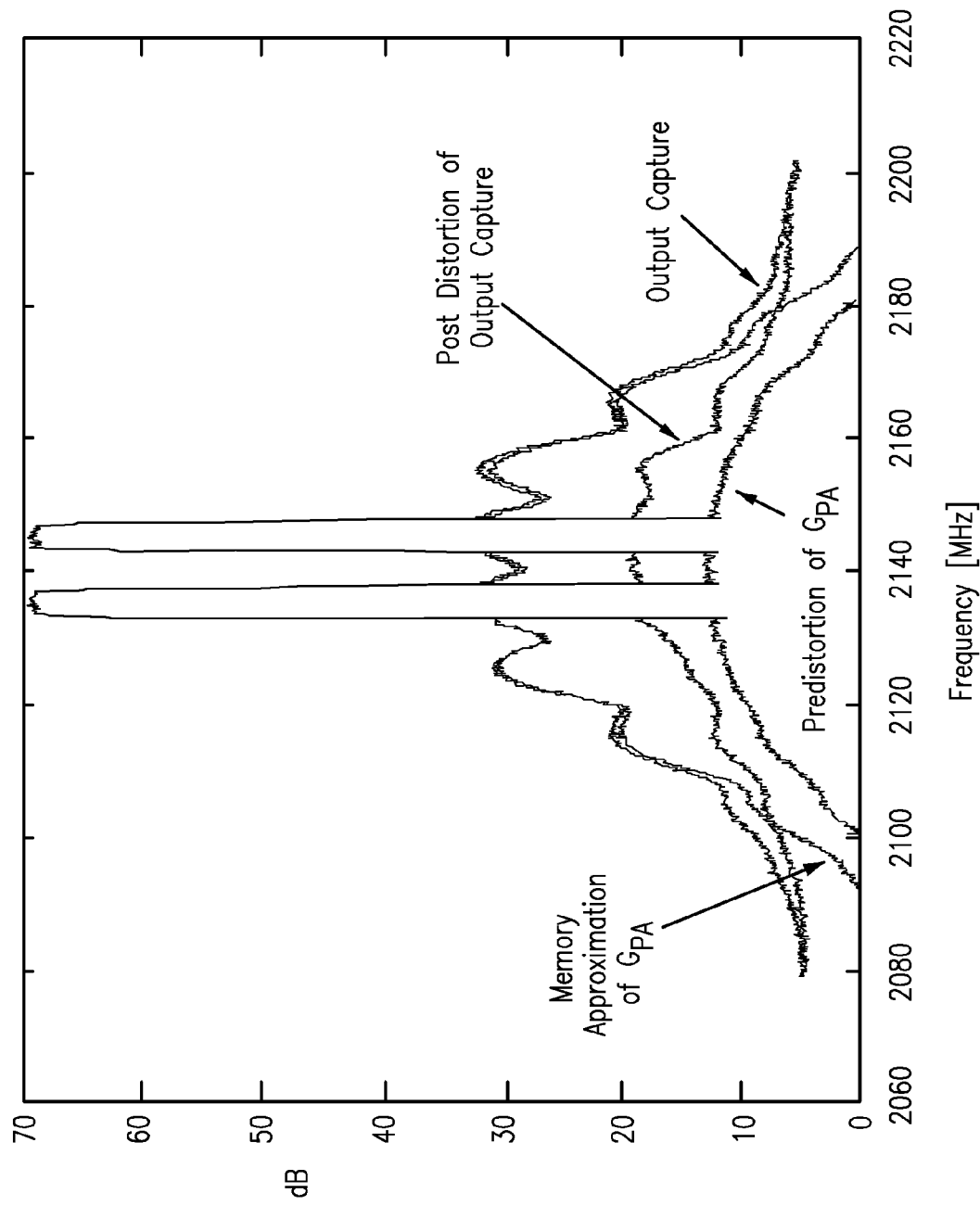
FIG. 11 is a representation of simulated output spectra based on the memoryless nonlinearities PA model.

FIG. 11 shows the output spectra for four cases: the original output data capture (no linearization), the memoryless approximation of the uncorrected PA, the predistorted memoryless PA model, and the original output capture post distorted using the converged value of $G_{DPD}$. Table I contains the corresponding Adjacent Channel Leakage Power Ratio ("ACLR") measurements. There is a small difference (1 dB) between the original output data capture and the memoryless approximation of the uncorrected PA within the upper ACLR$_2$ band, which is due to memory-effects in the former.

Comparing the uncorrected and predistorted memoryless approximations, it can be seen that steady-state predistortion coefficients reduce the ACLR$_2$ by 19 dB to −58.0 dBc, which is well below the WCDMA specification. Although the predistorted results validate the measurement and estimation technique, the output spectrum and ACLR measurements are optimistic because the memory effects are not modeled.

A better approximation of the actual performance of the linearized transmitter is obtained by post distorting the output data capture using the converged value of $G_{DPD}$ because the memory effects and noise within the PA are included. These results are not a perfect prediction of the predistortion performance because the series nonlinearity of $G_{DPD}$ and $G_{PA}$ does not commute in general. However, the modeling error for modest nonlinearities is small. The post distortion ACLR values pass the WCDMA specification, but only marginally for the upper ACLR$_2$ band. This suggests that the memoryless predistortion would provide sufficient linearization of the PA for a 101 WCDMA input signal. Future research will look at applying this approach to PA models including memory effects, which should increase the ACLR margin for the above-mentioned PA.

TABLE I

ACLR FOR VARIOUS OUTPUT SPECTRA.

| Output Spectrum | ACLR$_1$ [dBc] | | ACLR$_2$ [dBc] | |
|---|---|---|---|---|
| | Lower | Upper | Lower | Upper |
| Output capture (uncorr.) | −41.1 | −40.3 | −39.0 | −37.5 |
| Memoryless $G_{PA}$ (uncor.) | −41.1 | −41.1 | −38.6 | −38.5 |
| Predistortion of $G_{PA}$ | −57.2 | −57.2 | −58.0 | −58.0 |
| Post distortion of OC | −52.4 | −50.9 | −54.5 | −50.8 |
| WCDMA spec. | <−45 | <−45 | <−50 | <−50 |

FIGS. 5 and 7 discussed above presents embodiments of the first type in which memoryless nonlinearities are detected and corrected. Embodiments of the second type in which memoryless and memory nonlinearities are detected and corrected are now discussed immediately below.

The models of the predistortion and the residual nonlinearity of the transmitter are extended to include memory correction. In general, it is desirable to use the lowest order predistortion model that makes it possible to meet the specifications of the input signal's modulation format. That is, if the memoryless digital predistorter ("DPD") is adequate, then use it. However, if additional correction is required, the gain model can be extended to include memory correction. The need for memory correction is indicated by a large ACLR (for WCDMA) or by high variances in the LUT bins ($\sigma^2(\theta_n)$ in (22)) used in the memoryless coefficient estimation.

While it is possible to model memory using a pruned Volterra series based on delayed digital samples of the input signal, such an approach does not allow for asynchronous sampling. An approach for memory modeling that allows asynchronous sampling is to define the nonlinear gain as a function of |x| and $\partial|x|/\partial t$. A first possible model for the predistortion gain is $$G_{DPD}\left(|x|, \frac{\partial |x|}{\partial t}\right) = \sum_{i=0}^{N-1} b_i \cdot |x|^i + h_\omega\left\{\frac{\partial |x|}{\partial t}\right\} \cdot \sum_{k=0}^{K-1} s_k \cdot |x|^k \quad \text{(Eq. 33)}$$

where $s_k$ are predistortion coefficients associated with the memory correction, K is the order of the memory, and $h_\omega\{\ \}$ is an operator indicating that the envelope derivative is bandpass filtered to limit the high frequency noise. The gain model for the transmitter is $$G_{trans}\left(|x|, \frac{\partial |x|}{\partial t}\right) = \sum_{i=0}^{N-1} a_i \cdot |x|^i + h_\omega\left\{\frac{\partial |x|}{\partial t}\right\} \cdot \sum_{k=0}^{K-1} r_k \cdot |x|^k \quad \text{(Eq. 34)}$$

where $r_k$ are coefficients associated with the memory component of the residual nonlinearity. Note that the derivative $d|x|/dt$ is obtained by filtering the envelope of the WCDMA signal before the asynchronous sampling is applied to obtain $(|x|, h_\omega\{d|x|/dt\}, \gamma_{det})$ at the sample instant $t_s$.

When the memory is significant enough to require modeling, it is beneficial to store $\gamma_{det}$ as a function of two dimensions, $(\theta, d|x|/dt)$, usually in a 2-dimensional LUT. However, the form of (33) allows the coefficients of the residual nonlinearity to be estimated using 2 sets of 1-D LUTs instead of one set of 2-D LUTs. A new measure of the memory is needed, which is $$\psi(k) = \frac{[\gamma_{det}(k) - \gamma_0] \cdot h_\omega(k)}{|h_\omega(k)|^2} \quad \text{(Eq. 35)}$$

where $\gamma_0$ is the expected value of $\gamma_{det}$ (average radius of the circle formed by the asynchronously sampled points), $h_\omega(k)$ is the output of the filtered derivative $h_\omega(d|x|/dt)$ sampled at the time k. The LUTs for the memory estimation are $$L_{0,\partial|x|}(\theta_n) = \sum_k \beta_n(k) \cdot |h_\omega(k)|^2 \quad \text{(Eq. 36)}$$

$$L_{1,\partial|x|}(\theta_n) = \sum_k \beta_n(k) \cdot [\gamma_{det}(k) - \gamma_0] \cdot h_\omega(k). \quad \text{(Eq. 37)}$$

The mean LUT for the memory detection is $$E[\psi(\theta_n)] = \frac{L_{1,\partial|x|}(\theta_n)}{L_{0,\partial|x|}(\theta_n)}. \quad \text{(Eq. 38)}$$

Using the mean LUT, the demodulated signal becomes $$\Psi_{m\theta} = \frac{1}{N_{bins}} \cdot \sum_{n=1}^{N_{bins}} E[\psi(\theta_n)] \cdot \exp(-j \cdot m \cdot \theta_n). \quad \text{(Eq. 39)}$$

As in the memoryless case, it is necessary to integrate the measurements over several values of $\rho$. The relationship between the memory measurements ($\psi_\theta, \psi_{2\theta}$) and the residual memory coefficients, $\underline{r}$, is approximated by $$M \cdot [\, r_0^* \; r_1^* \; r_2^* \; r_3^* \,]^T \approx \begin{bmatrix} \Psi_\theta \\ \Psi_{2\theta} \end{bmatrix} \quad \text{(Eq. 40)}$$

where M is the same matrix defined in (12). The memory coefficients of the predistortion gain are updated using $$\underline{s}(t_{i+1}) = \underline{s}(t_i) - \alpha \cdot [r_0 r_1 r_2 r_3]^T. \quad \text{(Eq. 41)}$$

The complexity of the memory model can be adjusted using the polynomial order K. In most cases, the order of the memory will be less than the order of the memoryless nonlinearity (that is, K<N), in which case a subset of the matrix M is used for the former. Another method of increasing the complexity of the memory model is to apply a set of bandpass filters, $h_{\omega(n)}$, with different (minimally overlapping) frequency responses to the envelope derivative, $d|x|/dt$, and replicate the memory measurements ($\psi_\theta, \psi_{2\theta}$) for each $h_\omega$. Each $h_{\omega(n)}$ term would be multiplied by a separate polynomial of $|x|$, thereby adding more memory terms to Equation 33. It is also possible to use higher-order values of $h_\omega$ to increase the complexity (for example, $[h_\omega]^n$). However, these are not considered here because the overlap of the frequency responses with those of lower order basis functions would make the coefficient estimation more difficult.

The estimations of the memoryless and memory coefficients, $\underline{a}$ and $\underline{r}$, are decoupled in this implementation. This approximation is valid when $E[h_\omega(d|x|dt)]=0$ for each angle $\theta_n$ of the asynchronously sampled input signal. This is a reasonable assumption for a WCDMA input signal. It is recommended that the memoryless coefficients be adapted first, in isolation, because the memoryless distortion generated tends to be larger than that generated by the memory. Both components can be adapted concurrently once the residual memoryless nonlinearity is reduced to a level comparable to the memory component.

In a preferred embodiment, the predistortion gain model presented in Equation 33 is simplified such that the post distortion of the output capture comprises one term, $s_0$. The DPD gain becomes $$G_{DPD}\left(|x|, \frac{\partial |x|}{\partial t}\right) = \sum_{i=0}^{N-1} b_i \cdot |x|^i + h_\omega\left\{\frac{\partial |x|}{\partial t}\right\} \cdot s_0. \quad \text{(Eq. 42)}$$

The gain of the PA ($G_{PA}$) used in the simulation is represented by AM-AM and AM-PM LUTs for the memoryless component (as before), and augmented by a memory term $h_\omega q_0$. The value of $q_0$ is estimated from the output capture using a least square technique which is weighted spectrally to improve out-of-band model accuracy.

Figure 12:
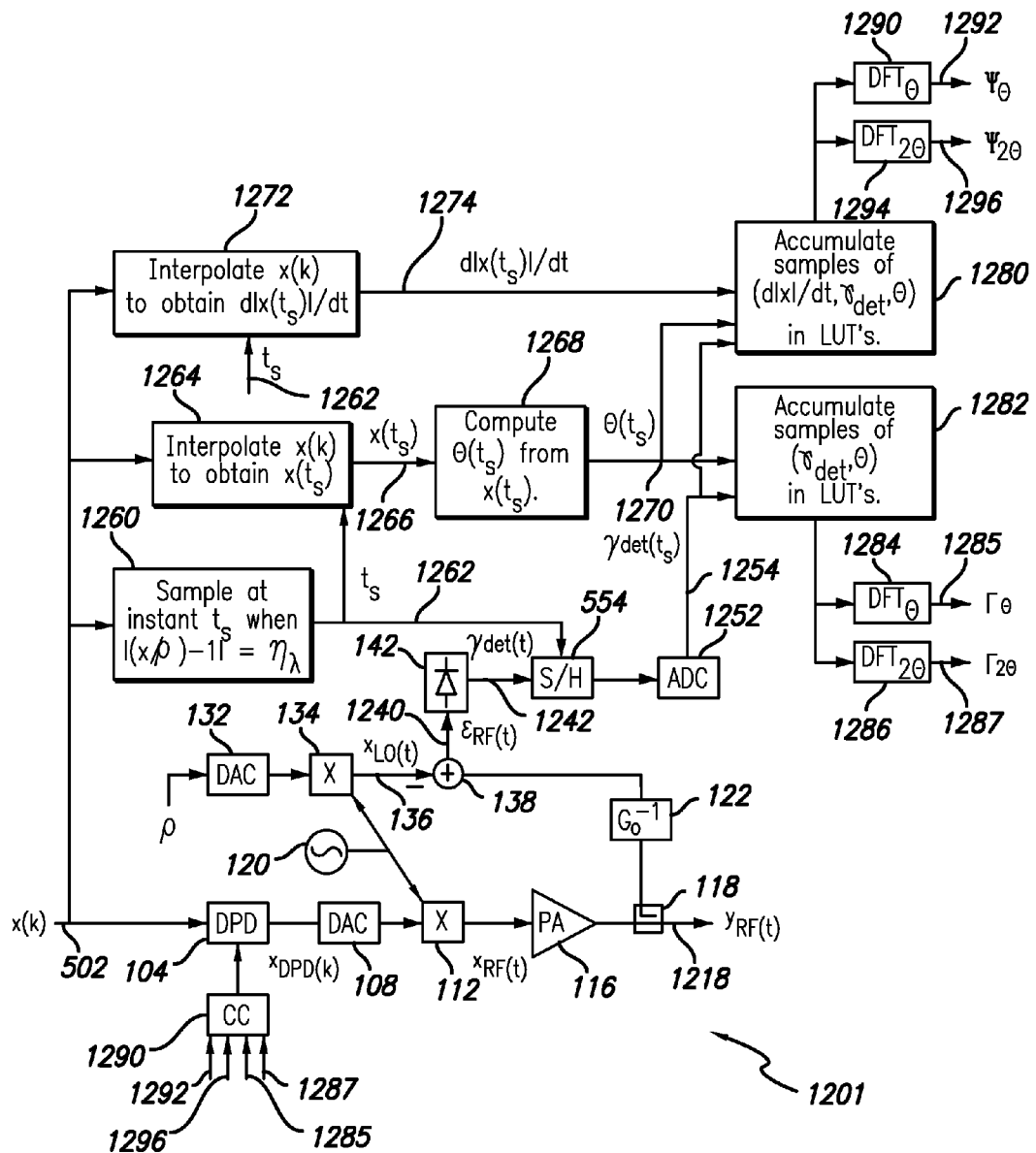
FIG. 12 is a block schematic drawing of an on-line, asynchronously-sampled predistortion linearized amplifier system for detecting memoryless and memory nonlinearities where the sampling instant is triggered by the value of the instantaneous amplitude.

Referring to FIG. 12, an embodiment in which both memoryless and memory nonlinearities are detected and corrected is illustrated. System 1201 asynchronously samples the input signal 502 to determine when the instantaneous amplitude is substantially equal to a predetermined level.

System 1201 depicted in FIG. 12 has a similar first signal path and measurement circuit as the memoryless system 501 depicted in FIG. 5. System 1201 also has a second signal path that is coupled to input 502 comprising an interpolating circuit 1264 for asynchronously sampling the input signal 502 during a sampling instant. A computing circuit 1268 computes the sampled instantaneous phase based on the sampled input signal. The accumulating circuit 1282 receives the sampled instantaneous phase and the sampled envelop signal $\gamma_{det}$ and calculates and stores moments in the Look Up Tables. DFT demodulating circuits 1284 and 1286 calculate the first and second harmonic error measurement 1285 and 1287 respectively.

System 1201 also has a third signal path receiving the input signal 502 comprising a sampling circuit 1260 which is configured to measure the instantaneous amplitude of the input signal 502 and trigger a sampling instant when a value of the instantaneous amplitude is substantially equal to a first predetermined level. The sampling circuit triggers the interpolating circuit 1264, the second interpolating circuit 1272, and the sample- and hold circuit 554. Sample- and hold circuit 554 is coupled to the square law detector 142 and samples envelope signal $\gamma_{det}$ during the sampling instant. The analog-to-digital convertor 1252 receives the sampled envelope signal $\gamma_{det}$, generates a digital representation of the sampled envelope signal $\gamma_{det}$, and feeds the sampled envelope signal to the accumulating circuit 1282 and the second accumulating circuit 1280.

System 1201 also has a fourth signal path coupled to the input, comprising a second interpolating circuit 1272 configured for asynchronously sampling the input signal 502 during a sampling instant and obtaining the sampled time derivative of the input signal 1274. A second accumulating circuit 1280 is configured for accumulating the sampled time derivative input signals, the sampled envelope signal, and sampled instantaneous phase. The second accumulating circuit 1280 is further configured for calculating and storing moments for memory estimation in Look Up Tables based on the sampled derivative input signals, the sampled envelope signal, and sampled instantaneous phase. The fourth signal path has demodulating circuits 1290 and 1294 that are configured to perform a digital Fourier Transformation on the memory estimation moments to yield memory estimation demodulated values 1292 and 1296.

The first and second harmonic error measurements 574 and 584, and the memory estimation demodulated values 1292 and 1296 are then fed into coefficient calculator 1290 which provides updated predistortion coefficients to predistorter 104.

Figure 13:
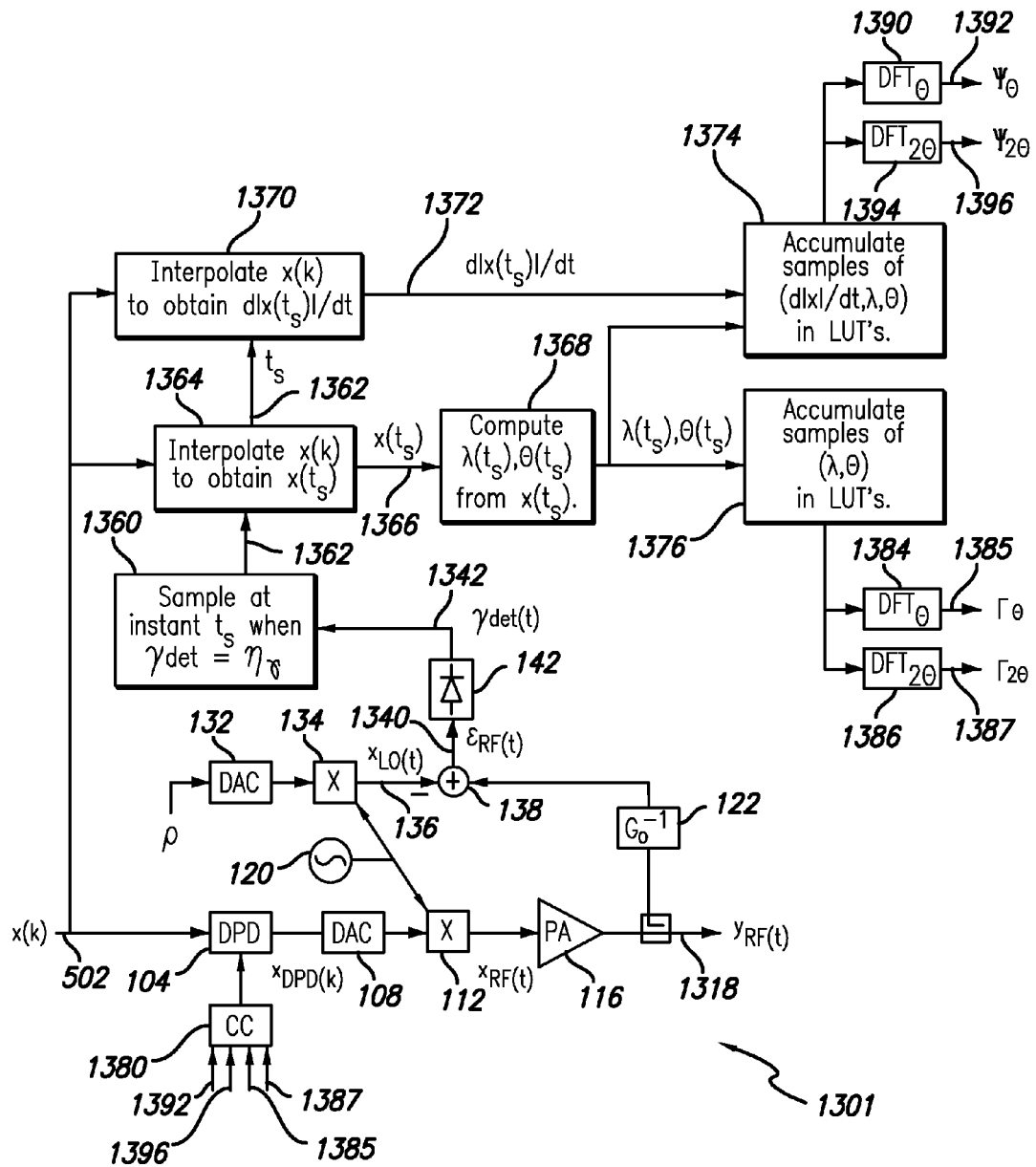
FIG. 13 is a block schematic drawing of an on-line, asynchronously-sampled predistortion linearized amplifier system for detecting memoryless and memory nonlinearities where the sampling instant is triggered by the value of the envelope signal.

Referring to FIG. 13, another embodiment in which both memoryless and memory nonlinearities are detected and corrected, is illustrated. System 1301 asynchronously samples the envelope signal $\gamma_{det}$ 1342 to determine when envelope signal $\gamma_{det}$ 1342 is substantially equal to a predetermined level.

System 1301 depicted in FIG. 13 has a similar first signal path and measurement circuit as the system 1201 depicted in FIG. 12. System 1301 also has a second signal path that is coupled to input 502 comprising an interpolating circuit 1364 for asynchronously sampling the input signal 502 during a sampling instant. A computing circuit 1368 computes the sampled instantaneous phase and sampled instantaneous amplitude based on the sampled input signal. The accumulating circuit 1376 receives the instantaneous phase and amplitudes and calculates and stores moments in the Look Up Tables. DFT demodulating circuits 1384 and 1386 calculate the first and second harmonic error measurement 1385 and 1387 respectively.

System 1301 also has an envelope sampling circuit 1360 coupled to the square law detector 142, where the envelope sampling circuit 1360 is configured for measuring the envelope signal $\gamma_{det}$ and triggering the sampling instant when a value of the envelope signal $\gamma_{det}$ is substantially equal to $\eta_\gamma$, a second pre-determined level.

System 1301 also has a fourth signal path coupled to the input, comprising a second interpolating circuit 1370 configured for asynchronously sampling the input signal 502 during a sampling instant and obtaining the sampled time derivative of the input signal 1372. A second accumulating circuit 1374 is configured for accumulating the sampled time derivative input signals, the sampled instantaneous amplitude, and sampled instantaneous phase. The second accumulating circuit 1374 is further configured for calculating and storing moments for memory estimation in Look Up Tables based on the sampled time derivative input signals, the sampled instantaneous amplitude, and sampled instantaneous phase. The fourth signal path has demodulating circuit 1390 and 1394 configured to perform a digital Fourier Transformation on the memory estimation moments to yield memory estimation demodulated values 1392 and 1396.

The first and second harmonic error measurements 1385 and 1387, and the memory estimation demodulated values 1392 and 1396 are then fed into coefficient calculator 1380 which provides updated predistortion coefficients to predistorter 104.

Figure 14:
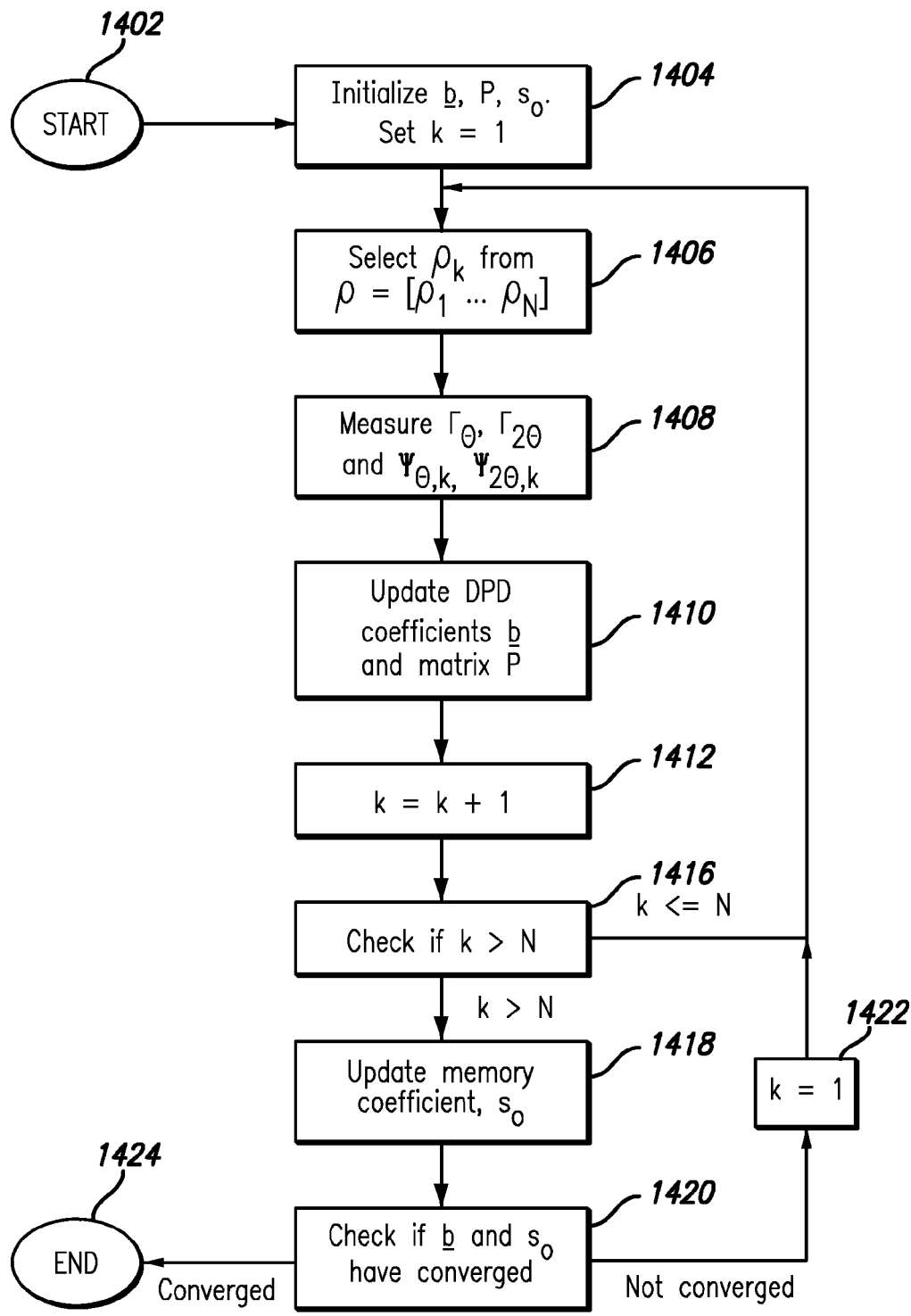
FIG. 14 is a flow chart of the process to estimate the predistortion coefficients based on the values of the demodulated signals.

FIG. 14 is a flow chart of the process to estimate the predistortion coefficients based on the values of the demodulated signals. At block 1402, the process is started. At block 1404, $\overline{b}$, the matrix P and $s_0$ are initialized, and variable k is set to 1. At block 1406, $\rho_k$ is selected from a set $[\rho_1, \ldots, \rho_N]$. At block 1408, the systems 1201 or 1301 process the input signal 502 using the selected $\rho_k$, and the first and second harmonic error measurements $\Gamma_\theta$ and $\Gamma_{2\theta}$, and the memory estimated demodulated values $\psi_\theta$, and $\psi_{2\theta}$ are measured. At block 1410, the coefficients $\overline{b}$, and the matrix P are updated using the recursive equations set forth in Equations 30-32. At block 1412, k is incremented by 1. At block 1416, the value of k is compared with N. If k is less than or equal to N, the process returns to block 1406. If k is greater than N, the process goes to block 1418 where the memory coefficient $s_0$ is updated. At block 1420, $\overline{b}$ and $s_0$ are checked to see if $\overline{b}$ and $s_0$ have converged. If $\overline{b}$ and $s_0$ have converged, the process ends at block 1424. If $\overline{b}$ and $s_0$ have not converged, the process goes to block 1422 which sets the value of k equal to 1 and returns to block 1406.

System 1201 is simulated using Matlab to determine the steady-state performance of a polynomial predistorter tuned using measurements derived from asynchronous samples of a WCDMA signal. The WCDMA input signal has a 101 carrier configuration modulated at a center frequency of 2.14 GHz and crest factor reduced to a peak-to-average power ratio (PAPR) of 7.2 dB. Data captures of the input and output signals of a class AB biased power amplifier, denoted by $x_{RFo}$ and $y_{RFo}$, respectively, are used to compute the gain of the PA model ($G_{PA}$) used in the simulation. The sample rate of the digitized data captures is 122.88 MHz. The input data capture is also used as the input signal x(k) in the simulation. Note that in the following subsections, $y_{RFo}$ denotes the digitized data capture of the actual uncorrected PA output signal whereas $y_{RF}$ is used to denote the simulated predistorted PA output signal computed using $G_{PA}x_{DPD}(k)$.

The memoryless and memory coefficient estimations are performed independently. The memoryless adaptation is applied initially in isolation to reduce the residual nonlinearity using (30)-(32), after which both the memoryless and memory adaptations are performed. The memoryless coefficients are updated after each measurement of $(\Gamma_\theta, \Gamma_{2\theta})$. In contrast, the memory coefficient $s_0$ is updated after $\psi_\theta$ has been measured for all four values of $\sigma_k$=[0.5, 0.8, 1.1, 1.4]. This was done for ease of implementation. As in the previous example, $\lambda$=0.35.

A weighted average of the residual memory estimates from different $\sigma_k$'s is used to update the memory coefficient: that is, $$s_0(i+1) = s_0(i) - \alpha \cdot \left[ \sum_{k=0}^{3} w_k \cdot \Psi_{\theta,k} \cdot [\rho_k^2 \lambda]^{-1} \right]^* \quad \text{(Eq. 43)}$$

where $\psi_{\Theta,k}$ is the memory measurement $\psi_\Theta$ obtained for $\rho_k$, $\alpha<1$, and $w_k$ is a weight defined by $$w_k = \frac{\min\{L_{0,d|x|}(\theta_n; \rho_k)\}}{\sum_{i=0}^{3} \min\{L_{0,d|x|}(\theta_n; \rho_i)\}}. \quad \text{(Eq. 44)}$$

That is, the weight used for each $\sigma_k$ is determined by the minimum bin value of the $L_{0,d|x|}$ LUT used in the residual memory estimation (see (36)).

Figure 15:
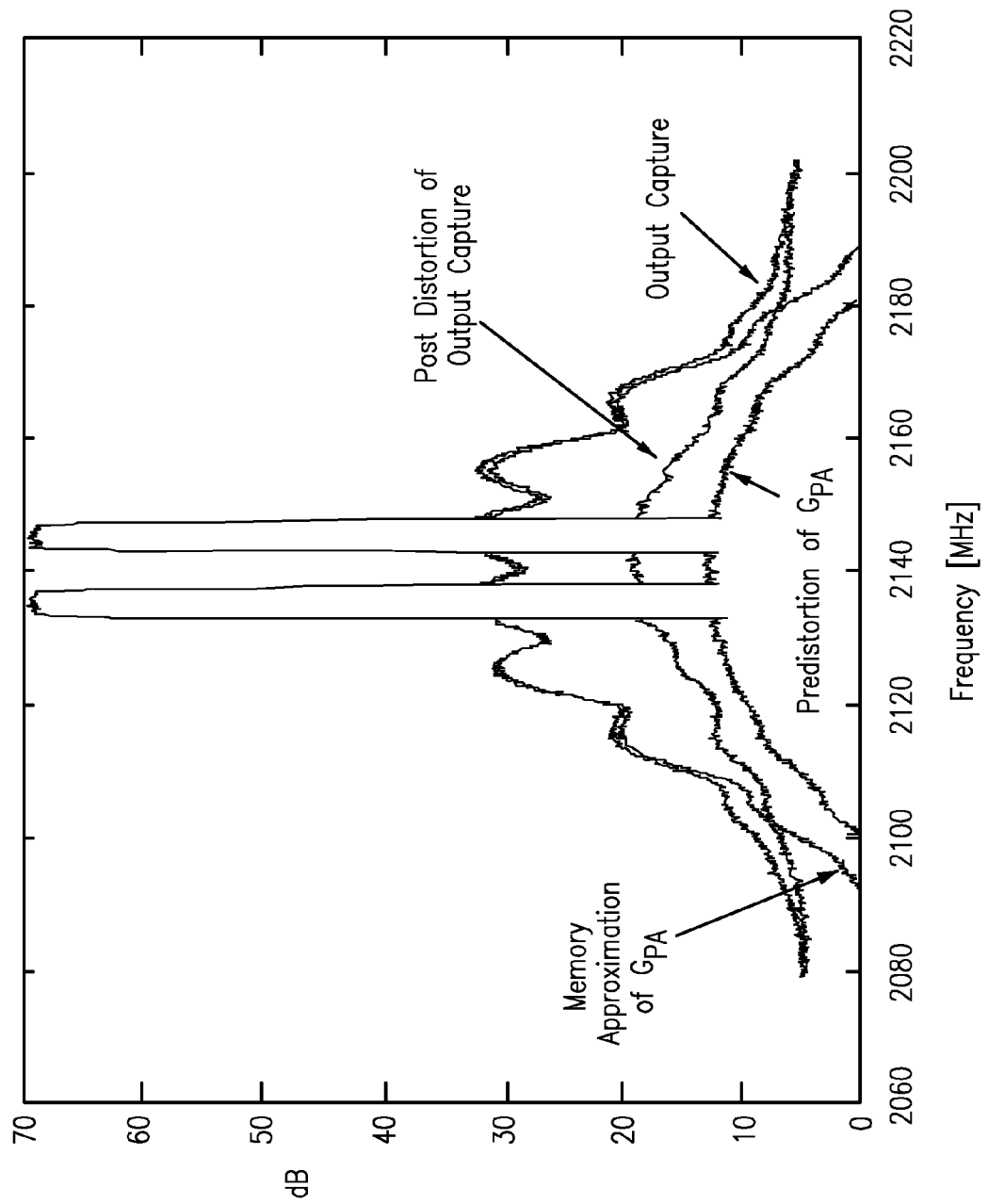
FIG. 15 is a representation of simulated output spectra based on the memory nonlinearities PA model.

FIG. 15 shows the output spectra for four cases: the original output capture $y_{RFo}$, the memory approximation of the uncorrected PA ($G_{PA}x$), the predistorted memory PA model ($G_{PA}X_{DPD}$), and the original output capture post distorted using the converged value of $G_{DPD}$ (that is, $G_{DPD}Y_{RFo}$). Table II contains the ACLR measurements. The correspondence between the original output capture and the approximation of the uncorrected PA is improved due to the inclusion of memory in the PA model. The difference within the upper $ACLR_2$ band is reduced to 0.3 dB.

Comparing the uncorrected and predistorted memory approximations, it can be seen that the steady-state predistortion coefficients reduce the $ACLR_2$ by 18.6 dB to −57.6 dBc. This is well below the WCDMA specification (−50 dBc) and validates the memory measurement and coefficient estimation. It also validates the implementation of the memoryless and memory coefficient estimations as decoupled processes.

Improved performance of the linearized transmitter is predicted by the post distortion of the output data capture $y_{RFo}$ using the converged value of $G_{DPD}$. The post distortion ACLR values pass the WCDMA specification, as before, and the margin for the $ACLR_2$ band is increased to 3.4 dB (see Table II). This suggests that the memory predistortion using (42) will provide sufficient linearization of the PA for a 101 WCDMA input signal.

TABLE II

ACLR FOR VARIOUS OUTPUT SPECTRA (MEMORY MODEL)

|  | $ACLR_1$ [dBc] | | $ACLR_2$ [dBc] | |
| --- | --- | --- | --- | --- |
| Output Spectrum | Lower | Upper | Lower | Upper |
| Output capture (uncorrected) | −41.1 | −40.3 | −39.0 | −37.5 |
| Memory $G_{PA}$ (uncorrected) | −41.4 | −40.8 | −39.3 | −37.8 |
| Predistortion of $G_{PA}$ | −57.1 | −57.2 | −57.6 | −58.1 |
| Post distortion of output $y_{RFo}$ | −52.2 | −51.5 | −53.4 | −53.4 |
| WCDMA specification | <−45 | <−45 | <−50 | <−50 |

The present invention has been described primarily to detect and correct the memoryless and memory based nonlinearities of a predistorter and power amplifier by asynchronously sampling signals of a circuit during normal operation. In this regard, the systems for measuring, interpolating, accumulating, and correcting the predistortion coefficients, and other functions described are presented for purposes of illustration and description. Furthermore, the description is not intended to limit the invention to the form disclosed herein. For example, the embodiments may comprise various physical forms including interconnected separate circuits employing discrete devices, one or more digital signal processors, one or more microprocessors, one or more systems performing the functions described above, either in part or in whole, or a combination of one or more physical forms. Accordingly, variants and modifications consistent with the following teachings, skill, and knowledge of the relevant art, are within the scope of the present invention. The embodiments described herein are further intended to explain modes known for practicing the invention disclosed herewith and to enable others skilled in the art to utilize the invention in equivalent, or alternative embodiments and with various modifications considered necessary by the particular application(s) or use(s) of the present invention.

What is claimed is:

1. An adaptive predistortion linearized amplifier system, comprising:
   an input receiving a time varying communication signal;
   a first signal path coupled to the input, comprising:
      a predistorter coupled to the input and performing a predistortion operation on the time varying communication signal using predistortion coefficients and providing a predistorted signal;
      an amplifier receiving and amplifying the predistorted signal and providing an amplified signal;
      an output coupled to the power amplifier and providing the amplified signal as an output signal;
   a measurement circuit coupled to sample the output signal for providing an error signal envelope signal;
   a second signal path coupled to the input, comprising
      a sampling circuit receiving the time varying communication signal and asynchronously sampling the time varying communication signal;
      a demodulating circuit configured to derive a demodulated error signal related to nonlinearities of the amplifier based on the error signal and a signal derived from the sampled time varying communication signal;
      a computing circuit configured for computing the sampled signal instantaneous phase based on the sampled input signals;
      an accumulating circuit configured for calculating and storing moments; and
      at least one demodulating circuit configured to perform a digital Fourier Transformation on the moments to yield demodulated values; and,
   a coefficient calculator configured for using the demodulated error signal to adapt the predistorter coefficients.

2. The adaptive predistortion linearized amplifier system as set out in claim 1, wherein the measurement circuit further comprises:
   a constant signal source providing an unmodulated signal;
   a local oscillator providing a local oscillation signal;
   a modulator receiving the unmodulated signal and the local oscillation signal and providing a carrier signal;
   a combiner circuit coupled to the modulator and the output, wherein the combiner circuit is configured for subtracting the carrier signal from the output signal to yield an error signal; and,
   a detector receiving the error signal and providing the envelope signal.

3. The adaptive predistortion linearized amplifier system as set out in claim 1, further comprising:
   a third signal path coupled to the input, comprising:
      an instantaneous amplitude sampling circuit measuring an instantaneous amplitude of the input signal when a value of the instantaneous amplitude is substantially equal to a first predetermined level; and, a sample-and-hold circuit configured for sampling the envelope signal, wherein the sample-and-hold circuitry provides the sampled envelope signal to the accumulating circuit;

wherein the accumulating circuit is further configured for accumulating the sampled envelope signal and sampled instantaneous phase, and wherein the accumulating circuit is further configured for calculating and storing moments based on the sampled instantaneous phase and the sampled envelope signal.

4. The adaptive predistortion linearized amplifier system as set out in claim 3, wherein the moments comprise the accumulated zero and first-order moments of the sampled envelope signal.

5. The adaptive predistortion linearized amplifier system as set out in claim 3, further comprising:
a fourth signal path coupled to the input, comprising:
a second sampling circuit configured for asynchronously sampling the input signal and obtaining a sampled time derivative of the sampled input signal;
a second accumulating circuit configured for accumulating the sampled time derivative input signals, the sampled envelope signal, and sampled instantaneous phase, wherein the accumulating circuit is further configured for calculating and storing moments for memory estimation based on the sampled time derivative input signals, the sampled envelope signal, and sampled instantaneous phase; and,
a second demodulating circuit configured to perform a digital Fourier Transformation on the memory estimation moments to yield memory estimation demodulated values;
wherein the coefficient calculator circuit is further configured for providing updated predistortion coefficients to the predistorter based on the memory estimation demodulated values.

6. The adaptive predistortion linearized amplifier system as set out in claim 5, wherein the moments comprise the accumulated zero and first-order moments of the sampled time derivative input values.

7. The adaptive predistortion linearized amplifier system as set out in claim 2, further comprising:
an envelope sampling circuit coupled to the detector, wherein the envelope sampling circuit is configured for measuring the envelope signal when a value of the envelope signal is substantially equal to a second pre-determined level;
wherein the computing circuit is further configured for computing the sampled instantaneous amplitude based on the sampled input signals, wherein the accumulating circuit is further configured for accumulating the sampled instantaneous amplitude and sampled instantaneous phase, and wherein the accumulating circuit is further configured for calculating and storing moments based on the sampled instantaneous phase and the sampled instantaneous amplitude.

8. The adaptive predistortion linearized amplifier system as set out in claim 7, wherein the envelope sampling circuit comprises a single bit comparator.

9. The adaptive predistortion linearized amplifier system as set out in claim 7, wherein the moments comprise the accumulated zero, first, and second-order moments of the sampled instantaneous amplitude.

10. The adaptive predistortion linearized amplifier system as set out in claim 7, further comprising:

a fourth signal path coupled to the input, comprising:
a second sampling circuit configured for asynchronously sampling the input signal and obtaining a sampled time derivative of the sampled input signal;
a second accumulating circuit configured for accumulating the sampled time derivative input signals, the sampled instantaneous amplitude, and sampled instantaneous phase, wherein the accumulating circuit is further configured for calculating and storing moments for memory estimation based on the sampled time derivative input signals, the sampled instantaneous amplitude, and sampled instantaneous phase; and,
a second demodulating circuit configured to perform a digital Fourier Transformation on the memory estimation moments to yield memory estimation demodulated values;
wherein the coefficient calculator circuit is further configured for providing updated predistortion coefficients to the predistorter based on the memory estimation demodulated values.

11. A method for adaptive predistortion of an amplifier system having an input, an output, an amplifier, and a measurement circuit, comprising:
receiving a time varying input communication signal at the input along a first signal path;
sampling the time varying input communication signal to derive a sampled input signal comprising a subset of sampled signals and providing the sampled input signal to a second signal path;
pre-distorting the time varying input communication signal on the first signal path to provide a pre-distorted input signal;
upconverting the pre-distorted input signal to provide a modulated transmission signal;
amplifying the modulated transmission signal to provide an output signal;
sampling the output signal and providing the sampled output signal to a measurement circuit;
deriving an error signal from the sampled output signal in the measurement circuit;
detecting the error signal magnitude to provide an error signal envelope signal;
demodulating the error signal employing a signal derived from the sampled input signal provided by the second path to derive a demodulated error signal related to non-linearities of the power amplifier;
calculating an instantaneous phase of the sampled signals;
sampling the error signal envelope signal;
accumulating the sampled error signal envelope signal and sampled instantaneous phase;
calculating and storing moments based on the sampled instantaneous phase and the sampled error signal envelope signal;
determining the demodulated error signal based on the moments; and,
using the demodulated error signal to adapt a pre-distorter.

12. The method for adaptive predistortion of the amplifier as set out in claim 11, wherein:
deriving an error signal further comprises subtracting a carrier signal from the output signal;
demodulating the error signal further comprises deriving a demodulated signal related to misalignment of the measurement circuit; and,
using the demodulated error signal to adapt the pre-distorter further comprises updating the pre-distorter pre-distortion coefficients.

13. The method for adaptive predistortion of the amplifier as set out in claim 12, further comprising:
asynchronously sampling the input communication signal at sample points corresponding to fixed input signal amplitude; and,
measuring an instantaneous amplitude of the input communication signal.

14. The method for adaptive predistortion of the amplifier as set out in claim 13, further comprising:
asynchronously sampling the time varying input communication signal and obtaining a sampled time derivative of the time varying input communication signal;
accumulating the sampled time derivative input communication signals, the sampled error signal envelope signal, and sampled instantaneous phase;
calculating and storing moments for memory estimation based on the sampled time derivative input communication signal, the sampled error signal envelope signal, and sampled instantaneous phase;
performing a digital Fourier Transformation on the memory estimation moments to yield memory estimation demodulated values; and,
providing updated predistortion coefficients to the predistorter based on the memory estimation demodulated values.

15. The method for adaptive predistortion of the amplifier as set out in claim 11, further comprising:
asynchronously sampling the error signal envelope signal at sample points corresponding to a fixed level;
determining the sampled instantaneous amplitude based on the sampled input signal;
computing the sampled instantaneous phase based on the sampled input communication signal;
accumulating the sampled instantaneous amplitude and sampled instantaneous phase;
calculating and storing moments based on the sampled instantaneous phase and the sampled instantaneous amplitude; and,
determining the demodulated error signal based on the moments.

16. The method for adaptive predistortion of the amplifier as set out in claim 15, further comprising:
asynchronously sampling the time varying input communication signal and obtaining the sampled time derivative of the input communication signal;
accumulating the sampled time derivative input communication signals, the sampled instantaneous amplitude, and sampled instantaneous phase;
calculating and storing moments for memory estimation based on the sampled time derivative input communication signal, the sampled instantaneous amplitude, and sampled instantaneous phase;
performing a digital Fourier Transformation on the memory estimation moments to yield memory estimation demodulated values; and,
providing updated predistortion coefficients to the predistorter based on the memory estimation demodulated values.

17. A method for adaptive predistortion using online measurement, comprising:
receiving a time varying input communication signal having a modulation corresponding to a constellation diagram having a disk-like region in an IQ plane;
extracting a portion of the time varying input communication signal values to create a calibration signal substantially corresponding to a circle within the disk-like region;
pre-distorting and amplifying the time varying input communication signal to provide an amplified output;
sampling and measuring the output and employing the calibration signal to derive a demodulated error signal; and,
using the demodulated error signal to adaptively update pre-distortion coefficients for said predistortion, wherein using the error signal to adaptively update pre-distortion coefficients further comprises:
initializing predistortion coefficients in a predistorter;
initializing a matrix representing an error covariance of the predistortion coefficients in an error measurement circuit;
setting a bound variable to a value of one;
selecting an amplitude from a set of predetermined amplitudes;
updating the predistortion coefficients and the matrix using the demodulated error signal;
resetting the bound variable; and,
determining whether predistortion variables have converged.

18. The method for adaptive predistortion using online measurement as set out in claim 17, wherein using the error signal to adaptively update pre-distortion coefficients further comprises:
initializing a predistortion coefficient associated with memory correction;
measuring memory error measurements that reflect memory based nonlinearities of an amplifier system; and,
updating the predistortion coefficient associated with memory correction.

* * * * *